United States Patent
Yamaguchi et al.

(10) Patent No.: US 9,627,345 B2
(45) Date of Patent: Apr. 18, 2017

(54) SEMICONDUCTOR-MOUNTED PRODUCT AND METHOD OF PRODUCING THE SAME

(71) Applicant: Panasonic Intellectual Property Management Co., Ltd., Osaka (JP)

(72) Inventors: Atsushi Yamaguchi, Osaka (JP); Yasuo Fukuhara, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/907,256

(22) PCT Filed: Jul. 9, 2015

(86) PCT No.: PCT/JP2015/003461
§ 371 (c)(1),
(2) Date: Jan. 22, 2016

(87) PCT Pub. No.: WO2016/017076
PCT Pub. Date: Feb. 4, 2016

(65) Prior Publication Data
US 2016/0329295 A1 Nov. 10, 2016

(30) Foreign Application Priority Data

Jul. 29, 2014 (JP) .................................. 2014-153513

(51) Int. Cl.
*H01L 23/48* (2006.01)
*H01L 23/52* (2006.01)
(Continued)

(52) U.S. Cl.
CPC ............. *H01L 24/73* (2013.01); *H01L 24/11* (2013.01); *H01L 24/17* (2013.01); *H01L 24/32* (2013.01);
(Continued)

(58) Field of Classification Search
CPC ....... H01L 2224/97; H01L 2224/32245; H01L 2224/73204; H01L 2224/83192; H01L 23/49816; H01L 2224/0401; H01L 24/81; H01L 2224/16

USPC ......... 257/780, 781, 778; 438/612, 613, 614
See application file for complete search history.

(56) References Cited

U.S. PATENT DOCUMENTS 6,100,597 A * 8/2000 Nakamura ............ H01L 21/563
257/737
6,590,287 B2 * 7/2003 Ohuchi .................. H01L 21/563
228/180.22
(Continued)

FOREIGN PATENT DOCUMENTS

JP 2010-161419 7/2010
JP 2011-176050 9/2011
(Continued)

OTHER PUBLICATIONS

International Search Report of PCT application No. PCT/JP2015/003461 dated Oct. 6, 2015.

*Primary Examiner* — Sheila V Clark
(74) *Attorney, Agent, or Firm* — Wenderoth, Lind & Ponack, L.L.P.

(57) ABSTRACT

A semiconductor-mounted product includes a semiconductor package, a circuit board, a solder bonding part, and a resin reinforcing part. Wiring is formed on the surface of the circuit board, and the semiconductor package is mounted on the circuit board. The solder bonding part electrically connects the semiconductor package with the wiring. The resin reinforcing part is formed on a side surface of the solder bonding part such that the solder bonding part is partially exposed. The bonding part has a first solder region formed closer to the semiconductor package than the circuit board, and a second solder region formed closer to the circuit board than the semiconductor package.

11 Claims, 22 Drawing Sheets

(51) Int. Cl.
H01L 29/40 (2006.01)
H01L 23/00 (2006.01)

(52) U.S. Cl.
CPC .............. H01L 24/81 (2013.01); H01L 24/83 (2013.01); H01L 24/92 (2013.01); *H01L 2224/11332* (2013.01); *H01L 2224/13111* (2013.01); *H01L 2224/13113* (2013.01); *H01L 2224/13139* (2013.01); *H01L 2224/13147* (2013.01); *H01L 2224/16227* (2013.01); *H01L 2224/32225* (2013.01); *H01L 2224/73204* (2013.01); *H01L 2224/81191* (2013.01); *H01L 2224/81801* (2013.01); *H01L 2224/83192* (2013.01); *H01L 2224/83862* (2013.01); *H01L 2224/9211* (2013.01); *H01L 2924/014* (2013.01)

(56) References Cited

U.S. PATENT DOCUMENTS

| | | | | |
|---|---|---|---|---|
| 2001/0040290 | A1* | 11/2001 | Sakurai | H01L 23/3128 257/737 |
| 2004/0159944 | A1* | 8/2004 | Datta | H01L 23/49816 257/737 |
| 2004/0262778 | A1* | 12/2004 | Hua | H01L 24/81 257/778 |
| 2006/0038291 | A1* | 2/2006 | Chung | H01L 23/3128 257/738 |
| 2006/0065978 | A1* | 3/2006 | Nishiyama | H01L 21/563 257/737 |
| 2007/0045869 | A1* | 3/2007 | Ho | H01L 21/563 257/780 |
| 2011/0095423 | A1 | 4/2011 | Ohashi et al. | |
| 2012/0111617 | A1 | 5/2012 | Motomura et al. | |
| 2012/0309133 | A1 | 12/2012 | Wada et al. | |
| 2016/0035688 | A1* | 2/2016 | Fukuhara | H05K 3/3463 257/737 |

FOREIGN PATENT DOCUMENTS

| | | |
|---|---|---|
| JP | 2012-084845 | 4/2012 |
| JP | 2013-105809 | 5/2013 |
| WO | 2011/004542 | 1/2011 |
| WO | 2012/042809 | 4/2012 |

* cited by examiner

SEMICONDUCTOR-MOUNTED PRODUCT AND METHOD OF PRODUCING THE SAME

TECHNICAL FIELD

The technical field relates to a semiconductor-mounted product including a semiconductor component, and a method of producing the same.

BACKGROUND ART

As a method of mounting a semiconductor component on a board, there is a solder bonding method in which a bump formed of solder on the undersurface of the semiconductor component is coupled to an electrode on a circuit board for conduction. However, solder bonding of a bump with an electrode alone often provides an insufficient retention force that retains the semiconductor component to the circuit board. In this case, a thermosetting resin such as epoxy resin is used to reinforce bonding between the semiconductor component and the board.

As a resin-reinforcing method, such as solder fill and side fill are developed (refer to PTL 1, for example). Another technology is developed in which a resin-reinforcing solder paste is used that is a composition of thermosetting resin containing solder powder and a flux component (refer to PTL 2, for example). Still another technology is developed in which resin composition free from solder is deposited onto the surface of a solder ball (refer to PTL 3, for example).

A description is made of an example of related resin-reinforcing methods, referring to FIGS. 23A through 23C. FIGS. 23A through 23C are sectional views of an example of related surface mounting using a resin-reinforcing solder paste.

As shown in FIG. 23A, thermosetting resin composition 1 is preliminarily printed onto electrode 3 formed on the surface of circuit board 2. Then, sealant 5 is applied onto the surfaces of circuit board 2 and thermosetting resin composition 1 using syringe 4.

Next, as shown in FIG. 23B, semiconductor device 6 is mounted onto circuit board 2 with sealant 5 applied thereonto. In detail, terminals 7 formed on one surface of semiconductor device 6 are pointed toward circuit board 2, and semiconductor device 6 is landed on circuit board 3 as indicated by the arrows.

Subsequently, as shown in FIG. 23C, circuit board 2 and semiconductor device 6 are heated, and bonding part 10 is formed of solder part 8 and resin-hardened part 9. FIG. 23C is a sectional view of semiconductor device 6 after mounted.

CITATION LIST

Patent Literature

PTL 1: WO 2012/042809
PTL 2: Japanese Patent Unexamined Publication No. 2011-176050
PTL 3: Japanese Patent Unexamined Publication No. 2012-84845

SUMMARY OF THE INVENTION

A semiconductor-mounted product of the present invention includes a semiconductor package, a circuit board, a solder bonding part, and a resin reinforcing part. Wiring is formed on a surface of the circuit board, and a semiconductor package is mounted on the circuit board. The solder bonding part electrically connects the semiconductor package and the wiring. The resin reinforcing part is formed on a side surface of the solder bonding part such that the solder bonding part is partially exposed. The solder bonding part has a first solder region formed closer to the semiconductor package than the circuit board, and a second solder region formed closer to the circuit board than the semiconductor package.

This structure increases the reliability of connection between the semiconductor component and a circuit board thereby increasing the mounting reliability of the semiconductor packaging body including the semiconductor component. Furthermore, occurrence of solder flash due to reheating can be suppressed.

DESCRIPTION OF EMBODIMENTS

Figure 23A:
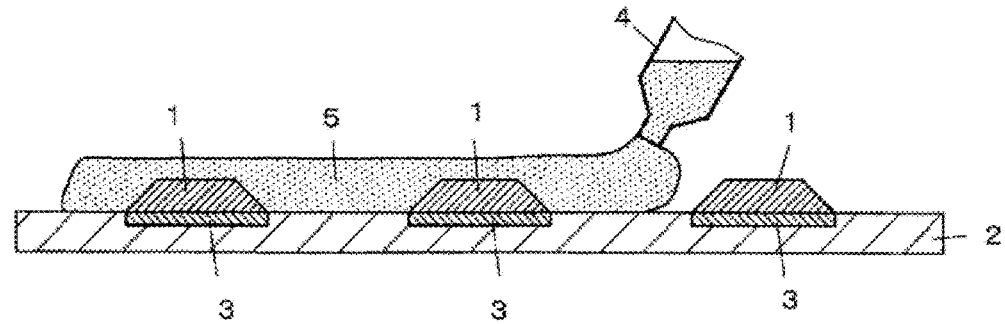
FIG. 23A is a sectional view illustrating a procedure of related surface mounting using a resin-reinforcing solder paste.
Figure 23B:
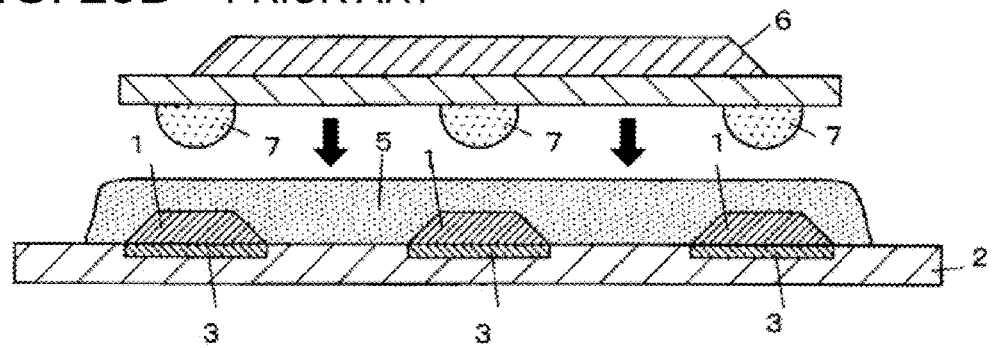
FIG. 23B is a sectional view illustrating a procedure subsequent to the procedure shown in FIG. 23A.
Figure 23C:
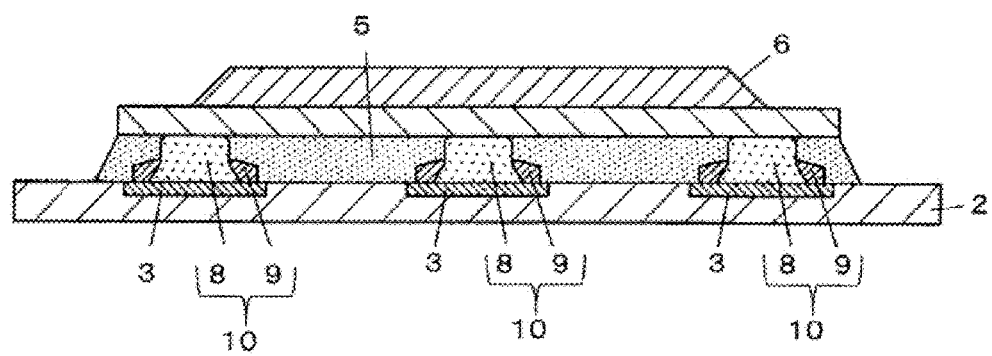
FIG. 23C is a sectional view illustrating a procedure subsequent to the procedure shown in FIG. 23B.

Prior to the description of some embodiments, a description is made of some problems in the related semiconductor device shown in FIGS. 23A through 23C. With the related semiconductor device, as shown in FIG. 23B, sealant 5 and thermosetting resin composition 1 may adhere to the surface of terminal 7, which may inhibit electrical connection between solder part 8 and electrode 3 when bonding part 10 is formed as shown in FIG. 23C.

Further, when projecting terminal 7 is pressed onto thermosetting resin composition 1 preliminarily print-formed, thermosetting resin composition 1 is press-spread downward. Accordingly, resin-hardened part 9 may not be high enough to reinforce the periphery of solder part 8.

Hereinafter, a description is made of some embodiments of the present invention with reference to drawings. In each embodiment, a component same as that of the preceding embodiment is given the same reference mark, and its detailed description may be omitted. Note that the scope of the present invention is not limited to the embodiments first through fourth. Modifications may be made on the embodiments within the scope of the concept of the present invention. The first to fourth embodiments can be applied in any combination with one another.

First Exemplary Embodiment

Figure 1A:
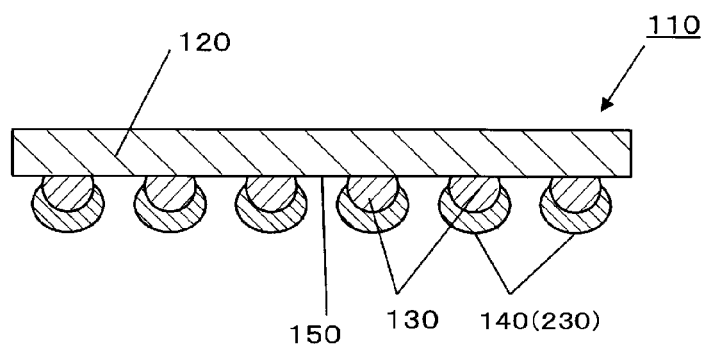
FIG. 1A is a sectional view of a semiconductor component according to a first exemplary embodiment of the present invention.
Figure 1B:
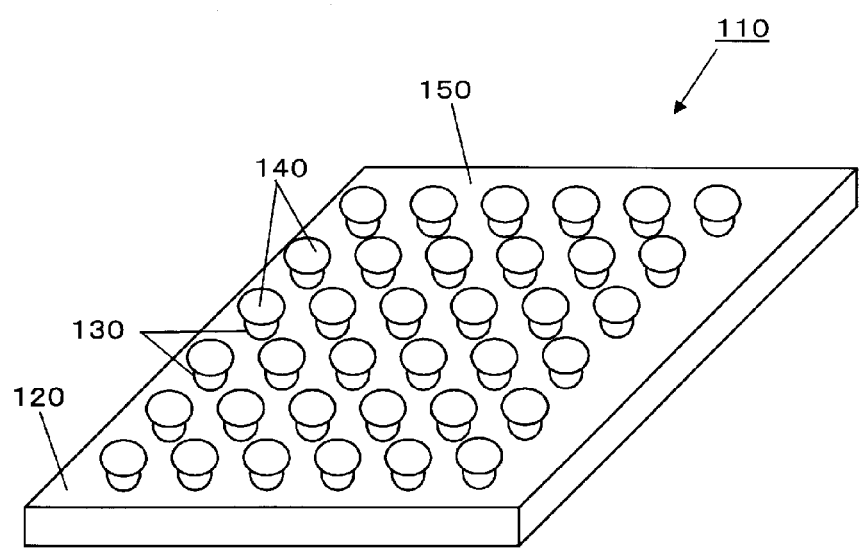
FIG. 1B is a perspective view of the semiconductor component shown in FIG. 1A.

FIG. 1A is a sectional view of semiconductor component 110 according to the first exemplary embodiment of the present invention. FIG. 1B is a perspective view of semiconductor component 110 shown in FIG. 1A.

Semiconductor component 110 includes semiconductor package 120 having mountable face 150, bump 130, and coating part 140. Bump 130 is formed on mountable face 150. Coating part 140 coats the top end of bump 130. Concretely, mountable face 150 of semiconductor package 120 has multiple bumps 130 formed at given intervals. Coating parts 140 on the surfaces of respective bumps 130 are separated from each other to maintain electric insulation between adjacent bumps 130.

Figure 2A:
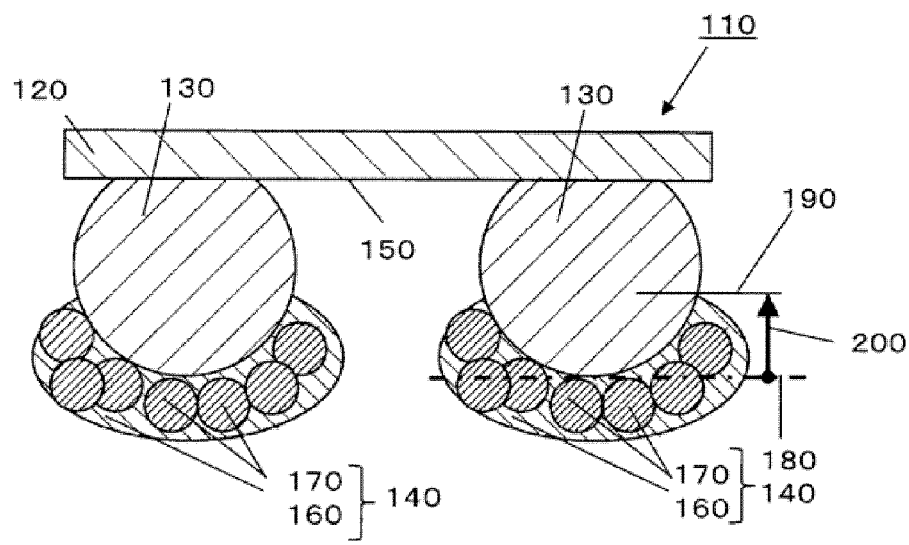
FIG. 2A is an enlarged sectional view of an essential part (around bumps) of the semiconductor component shown in FIG. 1A.
Figure 2B:
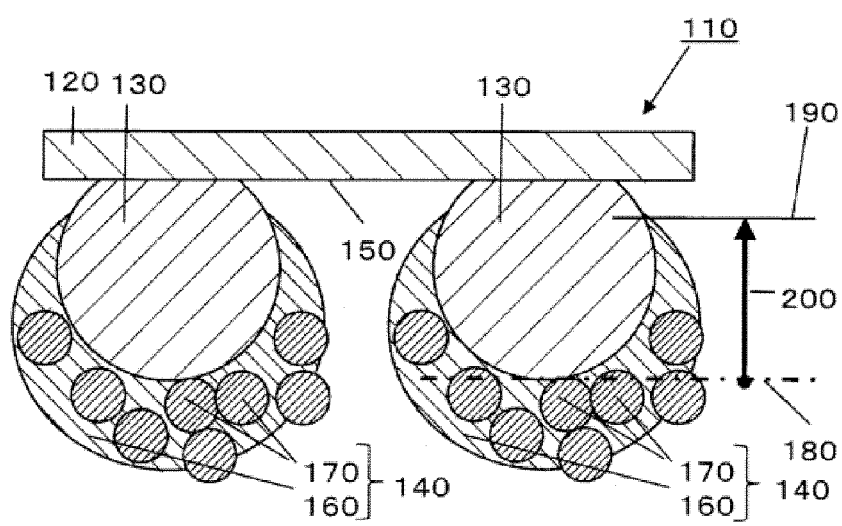
FIG. 2B is an enlarged sectional view of an essential part (around bumps) of the semiconductor component shown in FIG. 1A, with another structure.

FIGS. 2A and 2B are enlarged sectional views of an essential part (bumps 130 and their surrounding regions). FIGS. 2A and 2B are different from each other in the size of coating parts 140.

Bump 130 is formed of first solder. Meanwhile, coating part 140 is formed of a first composition containing solder powder 170 made of second solder, a flux component (not unillustrated), and a first thermosetting resin binder (hereinafter, first binder) 160.

First, a more detailed description is made of semiconductor component 110. The form of semiconductor package 120 is not especially limited as long as bump 130 made of a solder ball or the like can be formed on the mountable face of semiconductor package 120. Examples of semiconductor package 120 include a ball grid array package (BGA) and a chip scale package (CSP) that are produced by providing solder balls as bumps 130 on the undersurface of the interposer of an organic board, mounting a semiconductor chip on the top surface, and sealing the board with a seal resin.

Next, a description is made of first solder that forms bumps 130. The solder material for first solder is not especially limited. First solder may be a solder material based on Sn, for example. It is preferable that first solder is of a solder material with a melting point higher than that of solder powder 170 (second solder) contained in coating part 140. For first solder, a solder material (e.g., SAC305) based on Sn—Ag—Cu is effective. When a solder material with a high-melting point is used for first solder, bump 130 melts later than solder powder 170 during a reflow process. To melt bump 130 at a temperature similar to that of solder powder 170 during a reflow process, using an alloy containing Bi for first solder is effective, which lowers the melting temperature of bump 130. As described above, first solder forming bump 130 can be selected as appropriate according to an application purpose.

Next, a description is made of each material of first composition 230 for coating part 140. Second solder for solder powder 170 is not especially limited; a solder alloy based on Sn for example can be used. For second solder, a solder alloy that contains Sn with Ag, Cu, Bi, Zn, or In for example is desirably used. For second solder, it is particularly preferable to use a solder material with a melting point lower than that of bump 130 (first solder). It is effective to use, as second solder, a solder material with a relatively low melting point, which melts solder powder 170 earlier than bump 130 during a reflow process, thereby suitably solder-bonding semiconductor package 120 with a circuit board together.

Concrete examples of second solder with a low melting point include a Sn—Bi-based solder material containing Bi as an essential component. For example, Sn—Bi-based solder has a eutectic point of 139° C. A solder material containing Bi for second solder allows the melting point of second solder to be set between 139° C. and 232° C. Besides, a solder material containing Bi for second solder increases wettability with bump 130 and wiring on a circuit board. Further, a solder material containing Bi for second solder lowers the melting temperature of solder powder 170, which helps match the melting behavior of solder powder 170 with the thermally-curing behavior of first binder 160.

It is preferable that the content of solder powder 170 in the first composition falls within a range from 40 mass % to 95 mass %, inclusive. The content within this range provides reinforcement effect owing to a resin reinforcing part (described later), as well as electrically bonding property. It is more preferable that the content falls in a range from 70 mass % to 95 mass %, inclusive, because the decrease of the workability of application due to a higher viscosity of the first composition is suppressed. Note that solder powder 170 is present in a dispersion state in the first composition; this state is maintained in coating part 140 as well.

The flux component is not especially limited. Various types of materials such as a rosin component material represented by abietic acid, various types of amine and its salt, and organic acid such as sebacic acid, adipic acid, and glutaric acid can be used. A single component may be used, or two or more components may be mixed for a flux component.

It is preferable that the content of flux components falls within a range from 1 mass % to 50 mass %, inclusive, of the sum of the flux components and first binder 160. A content of flux components within this range provides superior flux effect; the flux components further increase the mechanically and electrically bonding property due to the hardened matter of coating part 140.

Figure 8:
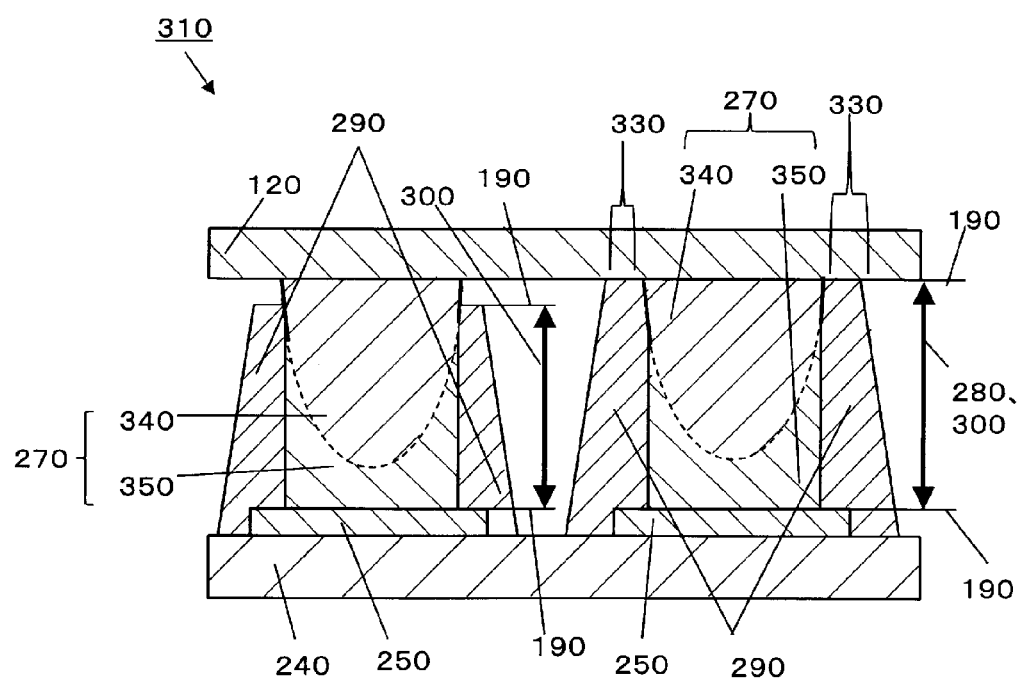
FIG. 8 is an enlarged sectional view of an essential part of the semiconductor-mounted product shown in FIG. 4A.

First binder 160 is present in an unhardened state or in a B-stage state in coating part 140. First binder 160 forms resin reinforcing part 290 surrounding the side surface of solder bonding part 270 during a reflow process as shown in FIG. 8 (described later). Accordingly, first binder 160 is not especially limited as long as first binder 160 can form reinforcing part 290 surrounding the side surface of solder bonding part 270 during a reflow process. As first binder 160, a resin primarily containing epoxy resin and a hardening agent is preferable. An epoxy resin hardens at a relatively low temperature and has a high adhesiveness. Using the resin primarily containing epoxy resin and a hardening agent for first binder 160 provides sufficient hardening property and sufficient reinforcement effect required for component mounting, even at a solder reflow temperature lower than the solder conventional reflow temperature.

An epoxy resin in liquid form at room temperature is preferred. Such an epoxy resin allows the other components such as solder powder 170 to be easily dispersed thereinto. Note that "in liquid form at room temperature" means "have fluidity at a temperature from 5° C. to 28° C., especially around 18° C., under the atmospheric pressure. Such an epoxy resin may be of any type with no special limitation in the molecular weight and the molecule structure as long as the resin has two or more epoxy groups in a molecule. Concretely, various types of liquid-form epoxy resins can be used such as glycidyl ether, glycidyl amine, glycidyl ester, olefin oxidation (alicycle). More concrete examples include bisphenol-type epoxy resin such as bisphenol A epoxy resin and bisphenol F epoxy resin; hydrogenated bisphenol-type epoxy resin such as hydrogenated bisphenol A epoxy resin and hydrogenated bisphenol F epoxy resin; biphenyl-type epoxy resin; naphthalene ring-contained epoxy resin; alicyclic epoxy resin; dicyclopentadiene-type epoxy resin; phenol novolac-type epoxy resin; cresol novolac-type epoxy resin; triphenylmethane-type epoxy resin; aliphatic epoxy resin; and triglycidyl isocyanurate. A single type may be used, or two or more types may be used together. Above all, in consideration of lowering the viscosity of coating part 140 and increasing the physical properties of a hardened matter, bisphenol-type epoxy resin and hydrogenated bisphenol-type epoxy resin are preferable for epoxy resin in liquid form at room temperature.

Together with the above-described epoxy resin in liquid form at room temperature, epoxy resin in solid form at room temperature can be used. Examples of such epoxy resin include biphenyl-type epoxy resin, dicyclopentadiene-type epoxy resin, and triazine framework epoxy resin.

Examples of a hardening agent for epoxy resin include an acid anhydride, phenol novolac, various types of thiol compound, various types of amines, dicyandiamide, imidazoles, metal complexes and their adduct compounds (e.g., an adduct modified material of polyamine). The usage of a hardening agent, which is appropriately set, falls preferably within a range from 3 parts by mass to 20 parts by mass, inclusive, for example, more preferably within a range from 5 parts by mass to 15 parts by mass, inclusive, with respect to 100 parts by mass of epoxy resin. The stoichiometric equivalent ratio of a hardening agent with respect to the epoxy equivalent of epoxy resin is preferably 0.8 or greater and 1.2 or less.

First binder 160 may contain a hardening accelerator as required, in addition to epoxy resin and a hardening agent. Examples of a hardening accelerator include imidazoles, tertiary amines, cyclic amines such as 1,8-diazabicyclo (5.4.0)undecene-7, 1,5-diazabicyclo(4.3.0)nonene-5 and their tetraphenyl borate salt, trialkylphosphines such as tributylphosphine, triarylphosphines such as triphenylphosphine, quaternary phosphonium salt such as tetraphenyl-phosphonium tetraphenyl borate and tetra(n-butyl)phosphonium tetraphenyl borate, metal complexes such as Fe acetylacetonato and their adduct compounds. The blending quantity of these hardening accelerators can be determined as appropriate in consideration of gelation time and preservation stability.

First composition 230 may contain a usual modifier, additive, and the like other than the above-described components. To adjust the viscosity and fluidity, a solvent and plasticizer with a low boiling point may be added to first composition 230. Also, as a thixotropy imparting agent for holding a print pattern, hydrogenated castor oil, stearic acid amide, or the like may be added.

A method for preparing first composition 230 is not especially limited; the following method can be used for example. First, solder powder 170, a part or the whole of the epoxy resin, and the flux component are mixed to produce a mixture. Then, a hardening agent is added to the mixture and mixed together. If a part of the epoxy resin is used first when the mixture is produced, the rest of the epoxy resin and a hardening agent are added and mixed together.

Next, a detailed description is made of a state where coating part 140 coats the surface of bump 130.

In FIGS. 2A and 2B, dot-and-dash line 180 indicates the position of the top end of bump 130. Auxiliary line 190 indicates the position of the end of coating part 140 that coats the surface of bump 130. Arrow 200 shows the height of coating part 140 that coats the surface of bump 130, from the top end of bump 130. As shown in FIGS. 2A and 2B, coating part 140 covers the surface of bump 130 from its the top end to its side surface. In other words, it is preferable that coating part 140 coats the top end of bump 130 and at least a part of its side surface continuously.

Further, coating part 140 preferably has a height of 40% or greater of the height of bump 130, where the height of bump 130 is defined as the distance from the top end of bump 130 to mountable face 150 of semiconductor package 120. In other words, the end of coating part 140 on the side surface of bump 130 is preferably closer to mountable face 150 than a position at a height of 40% of a height of bump 130 from the top end of bump 130 as a reference. Further, it is preferable that the height of coating part 140 be 60% or greater of the height of bump 130.

The height of coating part 140 being 40% or greater of the height of bump 130 makes resin reinforcing part 290 higher or thicker shown in FIG. 4A or similar drawings (described later), thereby reinforcing the periphery of solder bonding part 270 in a wall shape.

Note that 100% height of coating part 140 refers to a state where the whole surface of bump 130 is coated with coating part 140. In other words, this state is a state where bump 130 is continuously coated with coating part 140 from the top end to mountable face 150 of semiconductor package 120.

If the height of coating part 140 reaches 100%, solder powder 170 contained in coating part 140 can directly contact the mountable face of semiconductor package 120 between two adjacent bumps 130. In this case, it is effective to execute the processes shown in FIGS. 14, 19A through 19C, and 17.

Even if the height of coating part 140 is 40% of the height of bump 130 as shown in FIG. 2A, it is effective to execute the processes shown in FIGS. 6 and 7 (described later), which raises the height of coating part 140 to 50% or greater before a reflow process. Note that FIG. 2B shows a state where the height of coating part 140 is made greater than that in FIG. 2A. To make the height of coating part 140 50% or greater of the height of bump 130, further 60% or greater, it is effective to form the upper part of coating part 140 with first binder 160 contained in coating part 140 as shown in FIG. 2B.

The thickness of the region of coating part 140 where the top end of bump 130 is coated is preferably 5 µm or greater, more preferably 10 µm or greater, or 20 µm or greater. In this case, however, it is preferable to avoid coating parts 140 formed on two adjacent bumps 130 from contacting each other. Further, the thickness of the region of coating part 140 where the top end of bump 130 is coated is made greater than that where the side surface of bump 130 is coated. If the thickness of the region of coating part 140 where the top end of bump 130 is less than 5 µm, first solder region 340 and resin reinforcing part 290 may be inadequately formed. When the thickness of the region of coating part 140 where the top end of bump 130 is coated is the same or less than that of the side surface of bump 130, the mounting strength may be affected.

An average particle diameter of solder powder 170 contained in coating part 140 falls preferably within a range from 3 µm to 30 µm, inclusive. An average particle diameter of less than 3 µm makes solder powder 170 expensive, and second solder region 350 shown in FIG. 8 or similar drawings (described later) may be inadequately formed. An average particle diameter exceeding 30 µm may prevent coating part 140 from being evenly formed onto the surface of bump 130, and may further cause unevenness in the shape of second solder region 350 shown in FIG. 8 or similar drawings (described later).

Figure 3A:
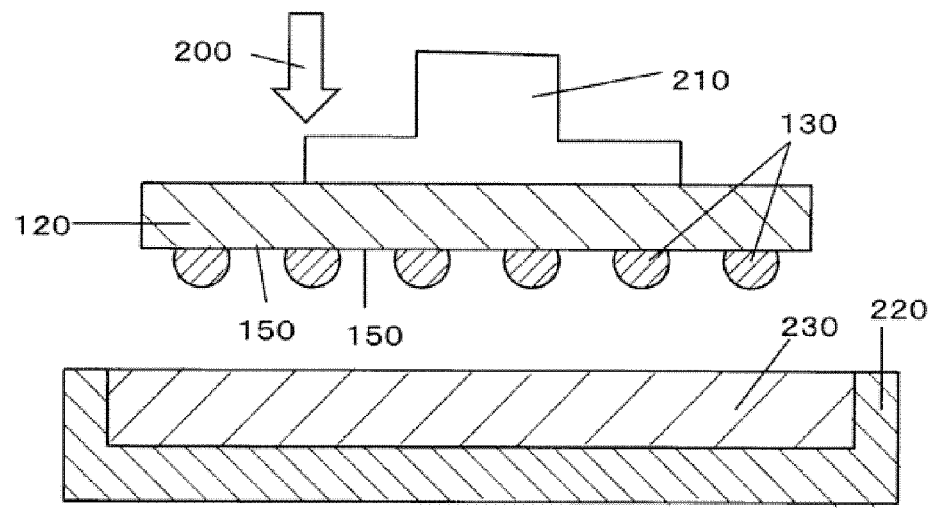
FIG. 3A illustrates a procedure of producing a semiconductor component according to the first embodiment of the present invention.
Figure 3B:
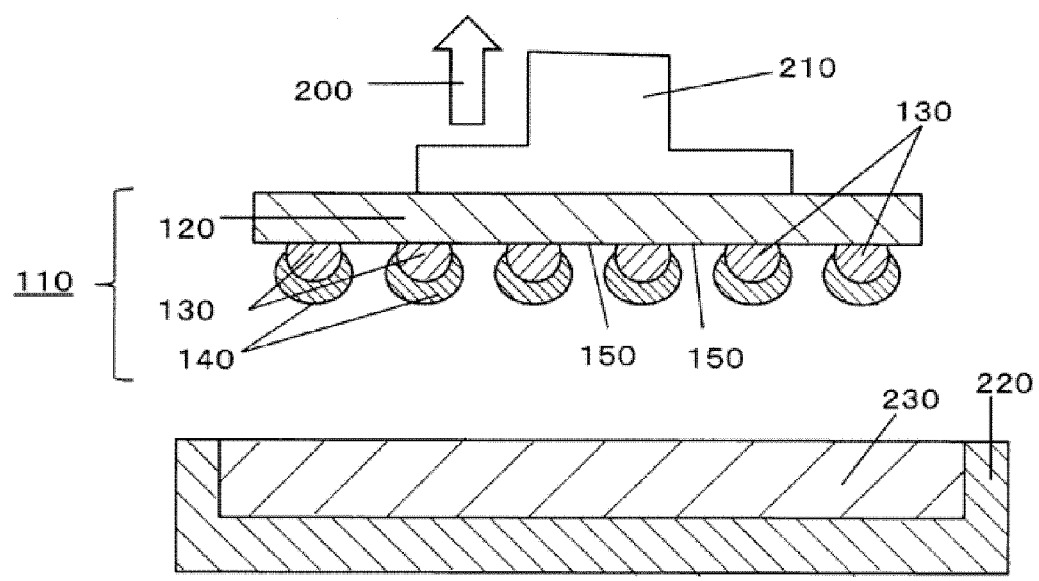
FIG. 3B illustrates a procedure of producing the semiconductor component, subsequent to that of FIG. 3A.

Next, a description is made of an example of method for producing semiconductor component 110 referring to FIGS. 3A and 3B, which illustrate procedures of producing semiconductor component 110.

As shown in FIG. 3A, semiconductor package 120 with bumps 130 formed thereon is held by component holding tool 210. The recessed pool provided in transfer table 220 is preliminarily filled with first composition 230.

To make uniform the thickness (i.e., depth) of first composition 230 poured into the pool of transfer table 220, a rubber spatula, a stainless-steel plate, or the like is used. It is effective to make the surface of first composition 230 flat (at most 10 µm or less at 3 σ/x, more effectively 5 µm or less, or 3 µm or less). The thickness (i.e., depth) of first composition 230 in transfer table 220 may be smaller than the height of bump 130.

In this state, the workpiece is moved in the direction indicated by arrow 200 to immerse bumps 130 on semiconductor package 120 held by component holding tool 210 into first composition 230.

Subsequently, bumps 130 are pulled up from first composition 230 in the direction indicated by arrow 200 in FIG. 3B. Coating part 140 thus made of first composition 230 is continuously formed from the top end of bumps 130 to a position of at least 40% height of bumps 130.

As described above, in order to produce semiconductor component 110, semiconductor package 120 having bumps 130 formed of first solder on mountable face 150 is prepared. Meanwhile, first composition 230 is prepared such that first composition 230 contains solder powder 170 made of second solder, a flux component, and first binder 160. Then, the top ends of bumps 130 are coated with a part of first composition 230.

The procedures shown in FIGS. 3A and 3B may be repeated more than once as required. This process increases the thickness and the amount of deposit (i.e., the amount of supply or the volume) while the height of coating part 140 remains constant, thereby reducing the variation in the thickness and the amount of deposit of coating part 140.

Figure 4A:
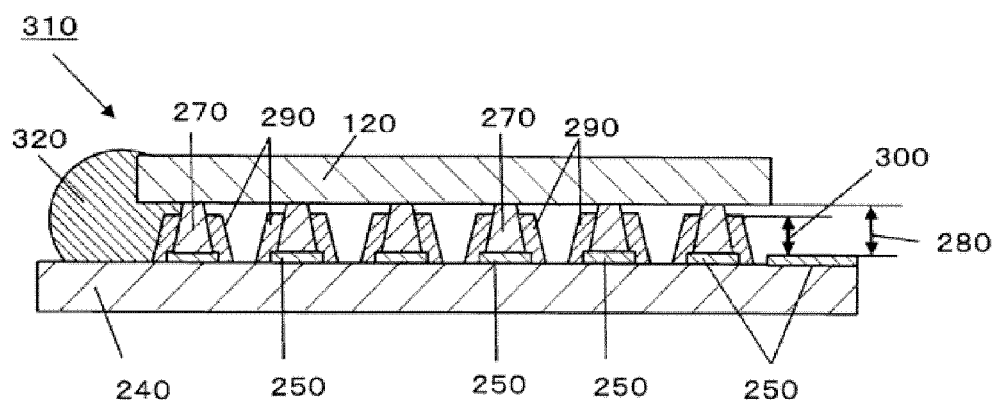
FIG. 4A is a partial sectional view of a semiconductor-mounted product with the semiconductor component according to the first embodiment applied thereto.
Figure 4B:
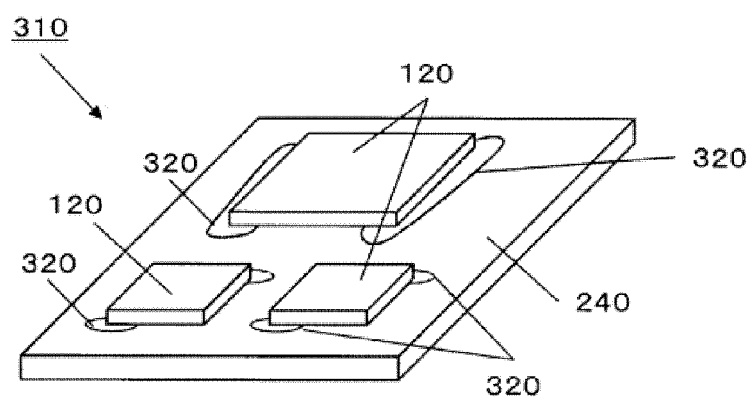
FIG. 4B is a perspective view of the semiconductor-mounted product shown in FIG. 4A.

Next, a description is made of a semiconductor-mounted product having a solder bonding structure according to the first embodiment, taking a case where semiconductor component 110 is mounted on a circuit board as an example, referring to FIGS. 4A and 4B. FIGS. 4A and 4B are respectively a sectional view and a perspective view of semiconductor-mounted product 310 that has semiconductor component 110 mounted on circuit board 240.

As shown in FIG. 4A, semiconductor-mounted product 310 includes semiconductor package 120, circuit board 240, solder bonding parts 270, and resin reinforcing parts 290. Circuit board 240 has wirings 250 formed on the surface thereof. Circuit board 240 has semiconductor package 120 mounted thereon. Solder bonding part 270 electrically connects semiconductor package 120 to wirings 250. Resin reinforcing part 290 is formed on the side surface of solder bonding part 270. Semiconductor-mounted product 310 has such a solder bonding structure.

Wiring 250 is provided on the mounted face of circuit board 240. Circuit board 240 is not especially limited in material, size and the like; however, a typically used printed-circuit board can be used that has an insulating layer made of a glass epoxy resin or the like. Wiring 250 is not especially limited and can be formed of a copper foil pattern with a thickness of approximately from 8 μm to 35 μm, for example.

A conventional semiconductor-mounted product has a so-called underfill structure, where a gap between the circuit board and the semiconductor package is completely filled with a fill material to leave no voids. With such a conventional underfill structure, however, it is difficult to completely fill the gap with a fill material without leaving any void in the gap in a case where a large number of bumps are formed on the semiconductor package. Accordingly, the conventional underfill structure with more bumps (i.e., a smaller diameter of individual bumps, or a higher density of a lot of bumps) may prevent the underfill material from being filled, thereby causing voids.

On the other hand, semiconductor-mounted product 310 has solder bonding part 270 surrounded and reinforced by resin reinforcing part 290 as shown in FIGS. 4A and 4B. Solder bonding part 270 is formed by melting bumps 130 on semiconductor component 110 by a reflow process.

For example, when the number of bumps 130 on semiconductor component 110 increases, the diameter of bumps 130 decreases, which causes a large number of bumps 130 to be formed on mountable face 150 of semiconductor component 110 in a higher density. Even in this case, resin reinforcing parts 290 uniformly reinforce the peripheries of respective solder bonding parts 270 in semiconductor-mounted product 310.

FIGS. 4A and 4B illustrate a structure in which semiconductor package 120 has fill material 320 at its corners and other parts. Fill material 320, however, is not essential; it has only to be used as required. Fill material 320 is an insulative adhesive for increasing the adhesive strength between semiconductor package 120 and circuit board 240. Fill material 320 can be a publicly known insulating material typically used for forming an underfill, side fill, and corner fill. As shown in FIGS. 4A and 4B, as a result that insulative fill material 320 is provided on the rim of semiconductor package 120 for connecting semiconductor package 120 to circuit board 240, the reliability of connection in semiconductor-mounted product 310 is increased. Fill material 320 does not need to cover the whole periphery of semiconductor package 120; it is necessary only that at least one side or at least one corner of semiconductor package 120 be covered. Note that fill material 320 may be formed either simultaneously with or after forming resin reinforcing part 290.

Figure 18:
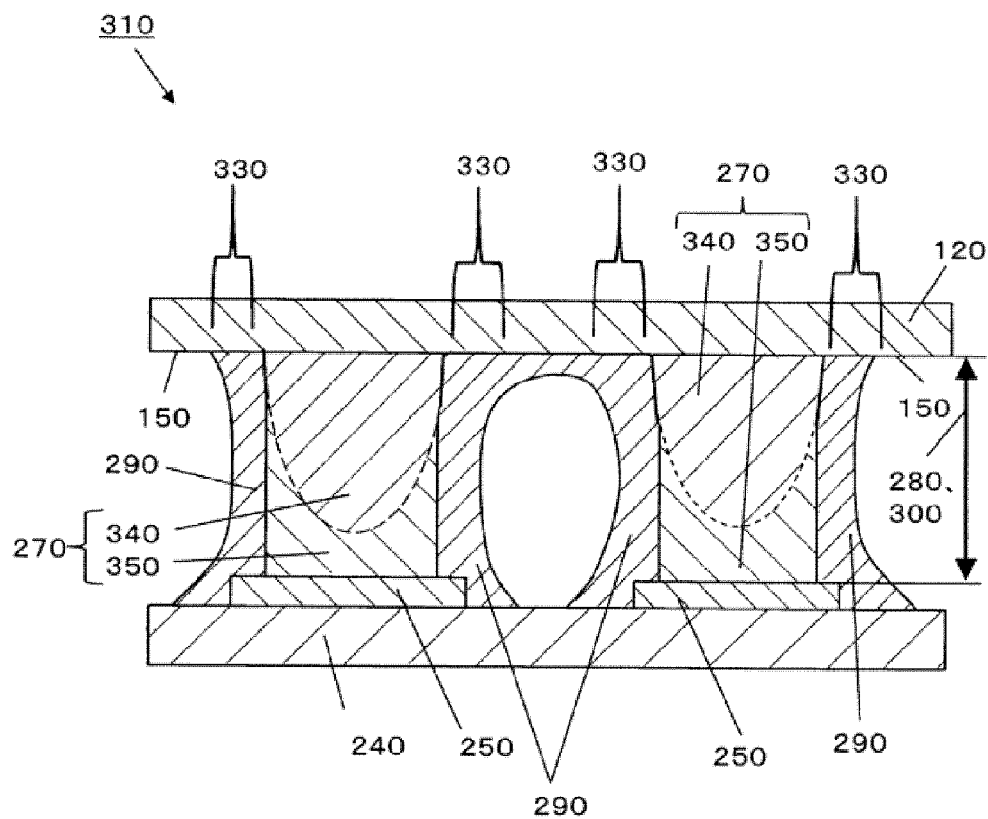
FIG. 18 is an enlarged sectional view schematically illustrating the solder bonding structure of a semiconductor-mounted product according to the third embodiment.

In FIG. 4A, height 300 of resin reinforcing part 290 is preferably 40% or greater of height 280 of solder bonding part 270, more preferably 60% or greater. As shown in FIG. 8 (described later), height 300 of resin reinforcing part 290 may be the same as (100%) height 280 of solder bonding part 270. As shown in FIG. 18 (described later), a part of resin reinforcing part 290 may covers a part of mountable face 150 of semiconductor package 120. Here, height 300 of resin reinforcing part 290 refers to a height from which the thickness of wiring 250 is subtracted, namely a height from wiring 250 as a reference.

Figure 5:
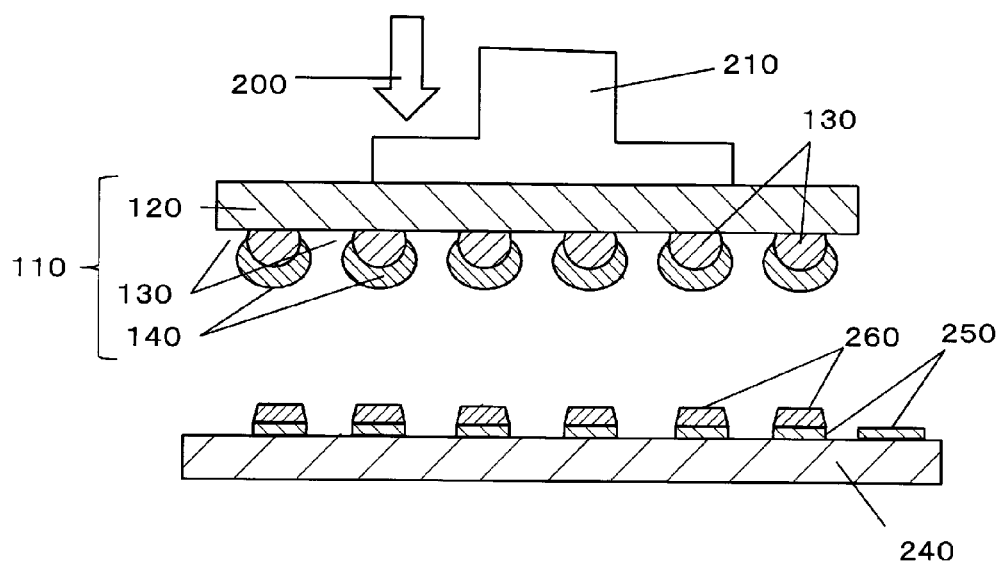
FIG. 5 exemplifies a procedure of mounting the semiconductor component shown in FIG. 1A onto the surface of a circuit board.
Figure 6:
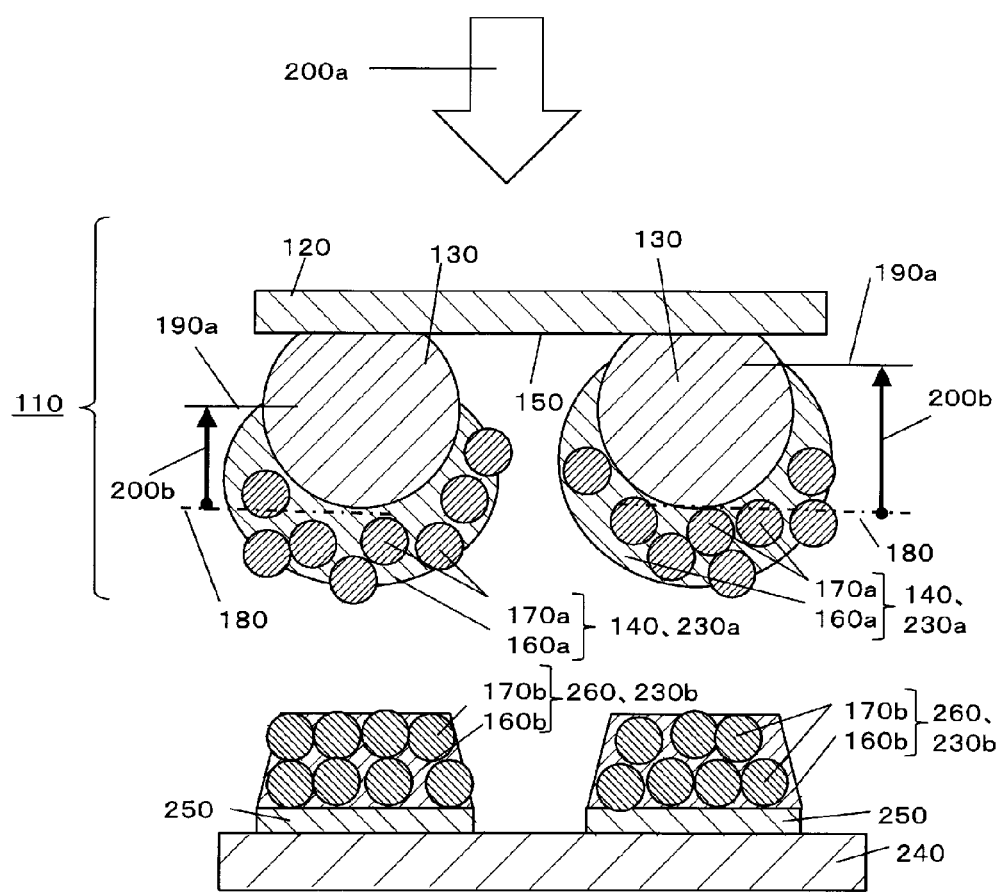
FIG. 6 is an enlarged view of an essential part in the procedure shown in FIG. 5.
Figure 7:
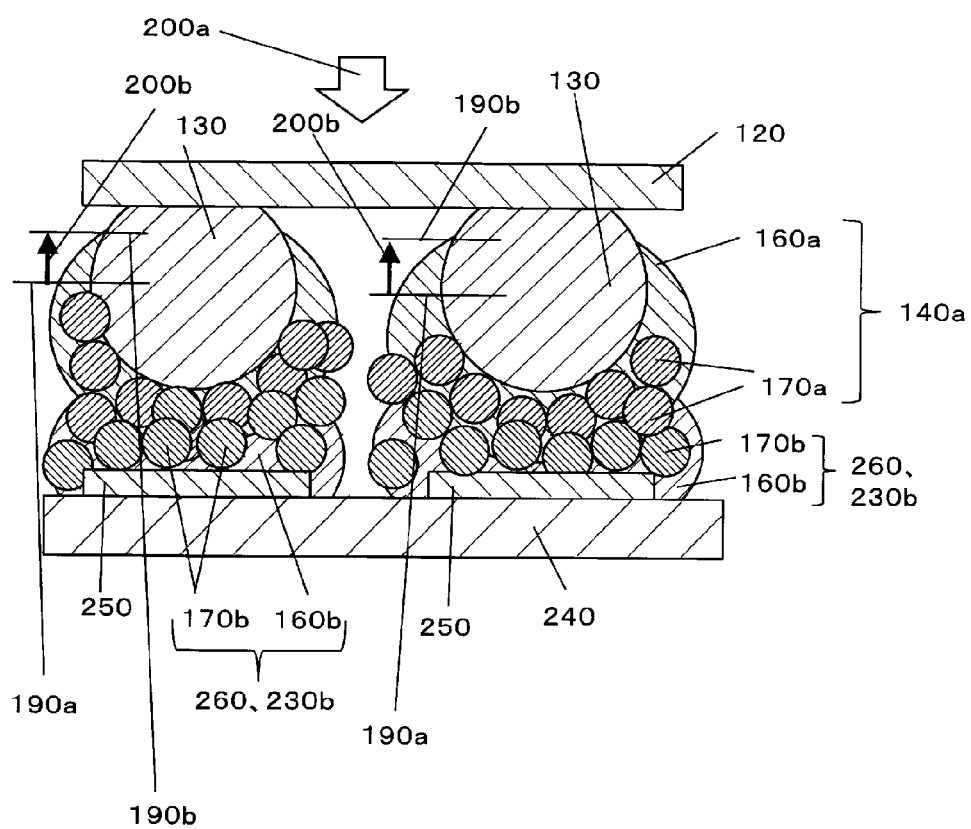
FIG. 7 is an enlarged sectional view of the essential part before a reflow process in a state where the semiconductor component is mounted on the surface of the circuit board according to the procedure shown in FIG. 5 or 6.

Next, a description is made of an example method of producing semiconductor-mounted product 310 referring to FIGS. 5 through 8. FIG. 5 illustrates a procedure of mounting semiconductor component 110 onto the surface of circuit board 240. FIG. 6 is an enlarged view of an essential part in the procedure shown in FIG. 5. FIG. 7 is an enlarged sectional view of the essential part before a reflow process in a state where semiconductor component 110 is mounted on the surface of circuit board 240 according to the procedure shown in FIG. 5 or 6. FIG. 8 is an enlarged sectional view of the essential part of the semiconductor-mounted product 310.

As shown in FIG. 5, semiconductor-mounted product 310 is produced by mounting semiconductor component 110 onto the face to be mounted (i.e., the surface on which wiring 250 is formed) of circuit board 240.

Arrow 200 indicates a direction along which semiconductor component 110 held by component holding tool 210 is loaded on wiring 250. Wiring 250 favorably has solder paste 260 preliminarily placed thereon by printing or the like. Note that, as shown in FIG. 6, it is effective that solder paste 260 is made of first composition 230b with the same composition as that of first composition 230a constituting coating part 140.

In the example shown in FIG. 6, coating part 140 is formed of first composition 230a containing solder powder 170a made of second solder, a flux component, and first binder 160a, on the top end of bump 130. Solder paste 260 is formed of first composition 230b containing solder powder 170b made of second solder, a flux component, and first binder 160b. Note that first compositions 230a and 230b may have the same composition or compositions of approximate components similar to each other.

Then, the workpiece is moved in the direction indicated by arrow 200a, and semiconductor component 110 is loaded on circuit board 240 on which solder paste 260 is formed to enter the state of FIG. 7.

As indicated by arrow 200a in FIG. 7, bump 130 on which coating part 140 is formed is loaded so as to be embedded into the top of solder paste 260. At this moment, the part of coating part 140a that coats the top end of bump 130 moves from the top end to the side surface of bump 130 due to a reactive force of solder paste 260. Then, the part of coating part 140a that coats the side surface of bump 130 is pressed up toward semiconductor package 120.

Auxiliary line 190a indicates the end position of coating part 140 before bumps 130 are loaded on solder paste 260. Auxiliary line 190b indicates the end position of coating part 140 after bumps 130 are loaded on solder paste 260.

Arrow 200b indicates the height (or the changed height) of the elevated part of coating part 140a around bump 130 when bump 130 is pressed to the solder paste. The phenomenon (a type of bulge phenomenon) in which coating part 140a is elevated around bump 130 is accounted as the following. That is, when bump 130 enters solder paste 260, coating part 140a covering the surface of bump 130 is removed by solder paste 260. Then, the removed coating part 140a is elevated as a type of bulge around bump 130 by the height indicated by arrow 200b.

By loading bump 130 having coating part 140a on solder paste 260 so as to be embedded into solder paste 260 in this way, coating part 140a covering bump 130 can be raised from the position indicated by auxiliary line 190*a* to that indicated by auxiliary line 190*b* by the length indicated by arrow 200*b* shown in FIG. 7.

The same advantage is provided in a case where commercially available solder paste that does not contain a thermosetting resin binder is used as solder paste 260 provided on wiring 250, In other words, by performing the process shown in FIG. 7, coating part 140*a* covering bump 130 can be raised from the position indicated by auxiliary line 190*a* to that indicated by auxiliary line 190*b* by the length indicated by arrow 200*b*.

As described above, even if the height of coating part 140 is approximately 40% of the height of bump 130 in a state before mounting shown in FIG. 2A, when coating part 140 is pressed onto solder paste 260, the height of coating part 140 becomes 50% or greater of the height of bump 130 as shown in FIG. 7.

Further, after undergoing a reflow process of solder, coating part 140*a* becomes higher than before the reflow process.

In the reflow process of solder, multiple solder powders 170*a* contained in coating part 140*a* melt and are unified together. This melting and unification squeeze out first binder 160*a* from the inside of coating part 140*a* to its outside. First binder 160*a* thus squeezed out covers the periphery of solder bonding part 270 shown in FIG. 8. Then, first binder 160 squeezed out is deposited around solder bonding part 270, and the height of resin reinforcing part 290 of semiconductor-mounted product 310 falls in the range between 40% and 100%, inclusive, of the height of solder bonding part 270 from wiring 250 as a reference.

Further, as a result that bumps 130 melt and become unified with solder powder 170 in the reflow process, the distance between circuit board 240 and semiconductor package 120 decreases. In other words, height 280 after the reflow process is less than that before it. Consequently, even if the height of resin reinforcing part 290 is the same between before and after the reflow processes, the relative height of resin reinforcing part 290 is 50% or greater of the height of solder bonding part 270 from wiring 250 as a reference.

Note that in FIGS. 6 and 7, using solder material with the same material composition or containing Bi for solder powders 170*a* and 170*b* makes their melting temperature equal. Using the same resin material for first binders 160*a* and 160*b* makes their curing behavior equal. Using similar resin materials having mutual compatibility for first binders 160*a* and 160*b* makes the binders to be favorably mixed together, thereby preventing interfaces from being produced between the binders.

Note that solder plating or the like may be formed on wiring 250 instead of solder paste 260. Even in this case, as a result that solder powder 170*a* dissolves into the melted solder plating and is unified during a reflow process, first binder 160*a* is squeezed out to the outside of coating part 140. Then, first binder 160*a* squeezed out makes resin reinforcing part 290 higher and thicker.

FIG. 8 is an enlarged sectional view of an essential part of the semiconductor-mounted product shown in FIG. 4A. In wetted surface 330, a part of mountable face 150 of semiconductor package 120 is wet with a part of resin reinforcing part 290. In this way, as a result that first binder 160 constituting resin reinforcing part 290 is deposited also on mountable face 150 at wetted surface 330, the mounting strength 17 increases.

As shown in FIGS. 4A and 8, semiconductor-mounted product 310, having undergone the above-described processes, has the above-described solder bonding structure composed of semiconductor package 120, circuit board 240, solder bonding part 270, and resin reinforcing part 290.

As shown in FIG. 8 solder bonding part 270 includes first solder region 340 and second solder region 350. First solder region 340 is formed closer to semiconductor package 120 than circuit board 240; second solder region 350 is formed closer to circuit board 240 than semiconductor package 120. First solder region 340 derives from first solder constituting bump 130 while second solder region 350 derives from second solder constituting solder powder 170 contained in coating part 140.

As described above, first solder forming bump 130 may be made of Sn—Ag—Cu-based solder material (e.g., solder material called SAC305).

Second solder forming solder powder 170 may be made of Sn—Bi-based solder material essentially containing Bi. Second solder region 350 containing Bi increases the wettability of solder bonding part 270 with respect to wiring 250. It is also effective to diffuse an Ag or Cu component contained in Sn—Ag—Cu-based first solder region 340 into Sn—Bi-based second solder region 350. Bi extends to a small degree and thus may cause a problem due to drop impact, for example. On the other hand, diffusion of a metal component such as Ag and Cu contained in the first solder into Sn—Bi-based second solder region 350 increases the ductility of the solder alloy, thereby improving the resistant property against drop impact. Meanwhile, as a result that Ag or Cu diffuses into Sn—Bi-based second solder region 350, second solder region 350 may become Sn—Bi—Ag—Cu-based solder. Note that these solder regions can be evaluated by a simple evaluation method such as an X-ray micro analyzer. Definite interfaces do not need to be formed between the regions. Rather, first solder region 340 and second solder region 350 desirably have a diffusion layer formed therebetween.

As shown in FIG. 8 and FIG. 18 (described later), as a result that the periphery of the part containing Bi (e.g., second solder region 350 in FIG. 8) is coated with resin reinforcing part 290 for reinforcement, solder bonding part 270 is strengthened. That is, when second solder region 350 contains Bi, it is preferable that resin reinforcing part 290 covers at least the side surface of second solder region 350.

To surround second solder region 350 containing Bi with resin reinforcing part 290, it is effective that the average thickness of resin reinforcing part 290 is large to 1 μm or greater, 5 μm or greater, or 10 μm or greater. An average of less than 1 μm may reduce the reinforcement effect.

As shown in FIG. 8, it is preferable that resin reinforcing part 290 covering the side surface of second solder region 350 lies across from the side surface of second solder region 350 to the side surface of first solder region 340 and covers the side surface of first solder region 340. Further, it is more preferable that resin reinforcing part 290 coats continuously a part from circuit board 240 to mountable face 150 of semiconductor package 120 through the side surface of solder bonding part 270. Resin reinforcing part 290 thus formed long produces a type of composite structural member formed of solder bonding part 270 and resin reinforcing part 290 formed therearound. Accordingly, even if semiconductor-mounted product 310 falls down, for example, the extent of shock waves generated by the accident can be suppressed to concentrate at solder bonding part 270. In this way, combining solder bonding part 270 with resin reinforcing part 290 absorbs part of energy of fall generated in the fall thanks to the difference in their physical properties (e.g., rigidity, elasticity, glass transition temperature, loss modulus).

Figure 9:
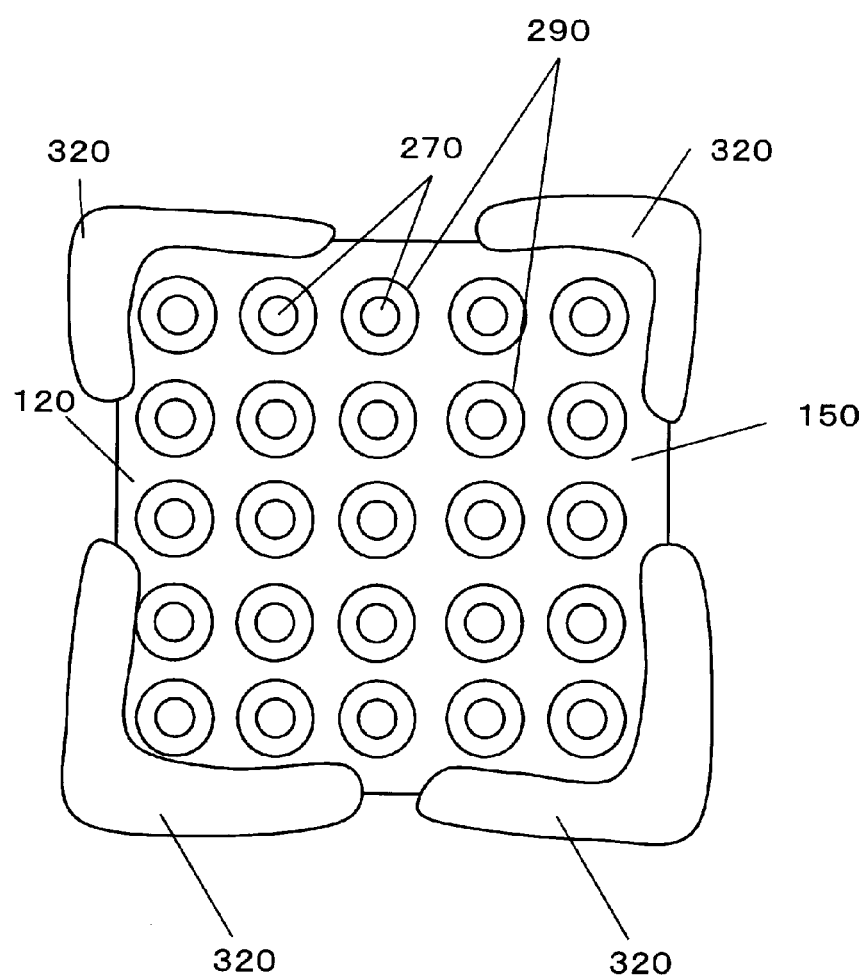
FIG. 9 is a schematic plan view of the mountable face of the semiconductor-mounted product according to the first embodiment of the present invention.

Next, a more favorable structure is described referring to FIG. 9. FIG. 9 is a schematic plan view of the mountable face of a semiconductor-mounted product according to the embodiment.

Resin reinforcing part 290 may be formed on mountable face 150 so as to surround the periphery of each of solder bonding parts 270 in a 360-degree ring shape. Each of resin reinforcing parts 290 formed on solder bonding parts 270 may be linked together on mountable face 150.

Further, as described above, the rim and other parts of semiconductor package 120 may be provided with corner fill or side fill formed of fill material 320. The fill significantly enhances the reliability of semiconductor-mounted product 310. Fill material 320 can be an insulating material (a typically used fill material) produced by adding an inorganic filler or the like to a thermosetting resin such as epoxy resin.

Hereinafter, a description is made of some advantages according to the embodiment, using some concrete examples of semiconductor component 110.

(1) Samples E1 Through E4

Semiconductor-mounted products according to samples E1 through E4 are produced as follows to evaluate the solder bonding strength.

First, as first composition 230, solder paste A is prepared so as to contain solder powder 170 containing Bi, a flux component, and first binder 160.

As solder powder 170, $Sn_{42}Bi_{58}$ made by Mitsui Mining & Smelting Co., Ltd. is used. As unhardened first binder 160, an epoxy resin (YD128 made by Nippon Steel & Sumikin Chemical Co., Ltd.) is used. As a hardening agent, a phenolic hardening agent (MEH-8000H made by Meiwa Plastic Industries, Ltd.) is used. As a flux component, abietic acid is used. Then, solder powder of 80.0 parts by mass, epoxy resin of 16.4 parts by mass, hardening agent of 0.9 parts by mass, flux component of 2.7 parts by mass are weighed, and uniformly mixed and kneaded with an agitator. In this way, a pasty first composition (solder paste A) is prepared.

Next, semiconductor component 110 shown in FIG. 1A is produced by the processes shown in FIGS. 3A and 3B described above. Concretely, a ball grid array (BGA, package size: 14×14 mm, ball diameter: 0.45 mm, pitch: 0.8 mm) is first prepared. The BGA is semiconductor package 120 having bumps 130 on mountable face 150. Next, transfer table 220 having a recessed pool is placed horizontally, and solder paste A is poured into this pool to form a smooth transfer surface of solder paste A. Then, according to the manners shown in FIGS. 3A and 3B, the top surface of the BGA (i.e., semiconductor package 120) is held by component holding tool 210 while bumps 130 face downward. Next, while keeping mountable face 150 parallel with the transfer surface of solder paste A, the BGA is lowered toward transfer table 220 to make bumps 130 contact with the transfer surface. In this way, solder paste A is made adhere to bumps 130. At this moment, the depth of solder paste A to be poured into transfer table 220 is increased or decreased to adjust the depth within which bumps 130 are immersed into solder paste A. In this way, four samples (samples E1 through E4) of semiconductor component 110 are produced so as to have coating part 140 made of solder paste A and coating bumps 130. Samples E1 through E4 are different from one another in the height of coating part 140.

Each sample of semiconductor component 110 thus produced is mounted on circuit board 240 in the procedure described next. First, FR-4 is prepared as the base material of circuit board 240 having wirings 250 on the face to be mounted. FR-4 refers to a base material produced by thermosetting an epoxy resin after being impregnated to glass-fiber cloth and forming the resultant into a plate shape. A glass epoxy board is formed by laminating copper foil onto the surface of FR-4 as a base material. Circuit board 240 has a thickness of 0.8 mm, and an electrode (land) diameter is 0.4 mm. To electrodes (land) in wirings 250 of circuit board 240, first composition (solder paste A) is supplied through a printing metal mask, which has an opening diameter of 0.4 mm.

Then, as shown in FIG. 5 described above, the BGA provided with coating part 140, and circuit board 240 are placed; bumps 130 and electrodes on wirings 250 are aligned; and the BGA is loaded on circuit board 240. Subsequently, circuit board 240 with the BGA loaded thereon is heated according to a given heating profile to melt-solidify bumps 130; and at the same time solder powder 170 is melted and unified with bumps 130. In this way, solder bonding part 270 is formed so as to bond wiring 250 and semiconductor package 120 together. Simultaneously, first binder 160 contained in the first composition is hardened to form resin reinforcing part 290 that reinforces solder bonding part 270 from its periphery. Following the above-described procedure, samples E1 through E4 of semiconductor-mounted product 310 are produced.

(2) Samples C1 and C2

Figure 10:
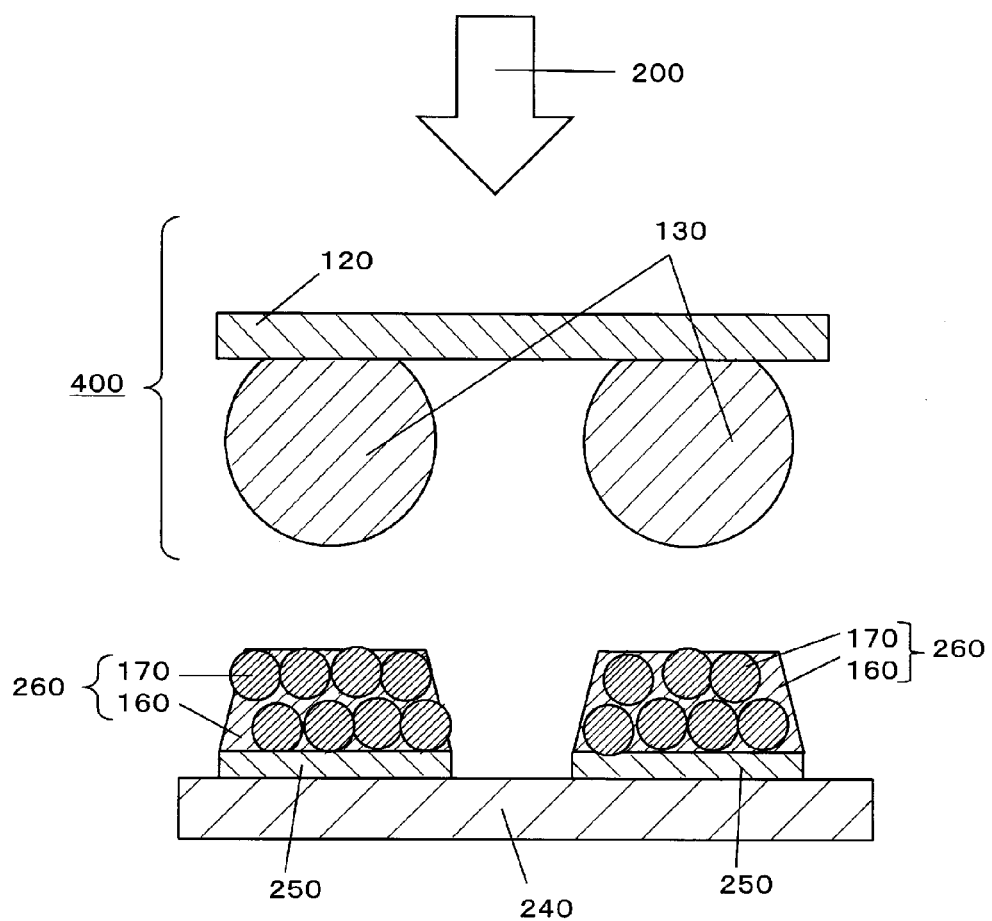
FIG. 10 is a sectional view of an example of mounting the semiconductor component shown as a comparative example.

Next, a description is made of samples C1 and C2 referring to FIG. 10. FIG. 10 is a sectional view illustrating a procedure of mounting the semiconductor component of sample C2. Sample C1 is produced as follows. A coating part is not formed on the surfaces of bump 130 on a BGA becoming semiconductor package 120. That is, a BGA having no solder paste A deposited on the surfaces of the bumps is used. Namely, semiconductor component 400 shown in FIG. 10 is used. Meanwhile, commercially available solder paste B is prepared for printing a metal mask. Solder paste B contains flux but not first binder 160. Then, solder paste B is printed onto the electrodes on wirings 250 of circuit board 240. Meanwhile, nothing is formed on the surfaces of bumps 130. The BGA is mounted on circuit board 240 in the same way as for samples E1 through E4 except for the above. In this way, a semiconductor-mounted product of sample C1 is produced.

For sample C2, in the same way as for sample C 1, a BGA becoming semiconductor package 120 is used for semiconductor component 400 without forming coating part 140 on bump 130. However, solder paste A is used for printing a metal mask. In other words, solder paste A is printed onto the electrodes on wirings 250 of circuit board 240. Otherwise, the BGA is mounted on circuit board 240 in the same way as in samples E1 through E4. The semiconductor-mounted product of sample C2 is thus produced.

(3) Reliability Evaluation

Next, the details and results are described of the reliability evaluation about samples E1 through E4, and samples C1 and C2.

(3-1) Temperature Cycle Test

Electrical inspection is performed on semiconductor-mounted products 310 of samples E1 through E4 and on the semiconductor-mounted products of samples C1 and C2 to separate them into good or defective ones. Then, the good products undergo heat cycle test to 1,000 cycles in which the products are immersed alternately in an −40° C. liquid bath for 5 minutes and an 80° C. liquid bath for 5 minutes.

(3-2) Drop Test

Electrical inspection is performed on semiconductor-mounted products 310 of samples E1 through E4 and on the semiconductor-mounted products of samples C1 and C2 to separate them into good or defective ones. Then, the good products are evaluated for how many times the product has been dropped until an instantaneous interruption occurs in the circuit of the product at an impact acceleration of 1,500 G/0.5 ms. The maximum number of drops is 1,000.

The evaluation results according to the above-described test are shown in table 1.

TABLE 1

|  | Sample | | | | | |
| --- | --- | --- | --- | --- | --- | --- |
|  | E1 | E2 | E3 | C1 | C2 | E4 |
| Solder paste on electrode | A | A | A | B | A | A |
| Solder paste of coating part | A | A | A | — | — | A |
| Height (%) of coating part | 40 | 50 | 80 | 0 | 0 | 35 |
| Height (%) of resin reinforcing part | 50 | 65 | 100 | 0 | 30 | 45 |
| Temperature cycle | >1,000 cycles | >1,000 cycles | >1,000 cycles | 250 cycles | 400 cycles | 500 cycles |
| Drop test | >1,000 times | >1,000 times | >1,000 times | 20 times | 250 times | 300 times |

Note that solder paste A in table 1 corresponds to first composition 230 described in the first embodiment. The height of a coating part refers to the height indicated by arrows 200 in FIGS. 2A and 2B. The height of a resin reinforcing part refers to the height indicated by the arrows 300 in FIGS. 4A and 8.

In samples E1 through E4, resin reinforcing part 290 surrounds the entire periphery of solder bonding part 270. As shown in table 1, especially in samples E1 through E3, where the height of coating part 140 is 40% or greater of the height of bump 130, height 300 of resin reinforcing part 290 has reached 50% or greater of height 280 of solder bonding part 270.

In sample C1, on the other hand, resin reinforcing part 290 is not substantially formed. In sample C2, the height of resin reinforcing part is only 30% of the height of the solder bonding part.

All of samples E1 through E3 have attained 1,000 cycles or more in the temperature cycle test and 1,000 times or more in the drop test. In sample E4, the height of coating part 140 is 35%, slightly lower than samples E1 through E3, and the height of resin reinforcing part 290 is less than 50%. Consequently, sample E4 is inferior to samples E1 through E3 in the evaluation results of the temperature cycle test and the drop test; however, superior to samples C1 and C2. Samples E1 through E4 thus have high mounting reliability.

Sample C1, where a resin reinforcing part is not formed, has caused problems in 250 cycles in the temperature cycle test and in 20 times in the drop test.

Sample C2, where the height of the resin reinforcing part is 30%, has caused problems in 400 cycles in the temperature cycle test and in 250 times in the drop test.

As described above, samples E1 through E4 having resin reinforcing part 290 formed around solder bonding part 270 after a reflow process have achieved favorable results both in the temperature cycle test and the drop test. The evaluation results of samples E1 through E4 prove that the height of coating part 140 is favorably 35% or greater, more favorably 45% or greater, of the height of bump 130.

(4) Studies on Problems Occurred in Sample C2

Figure 11:
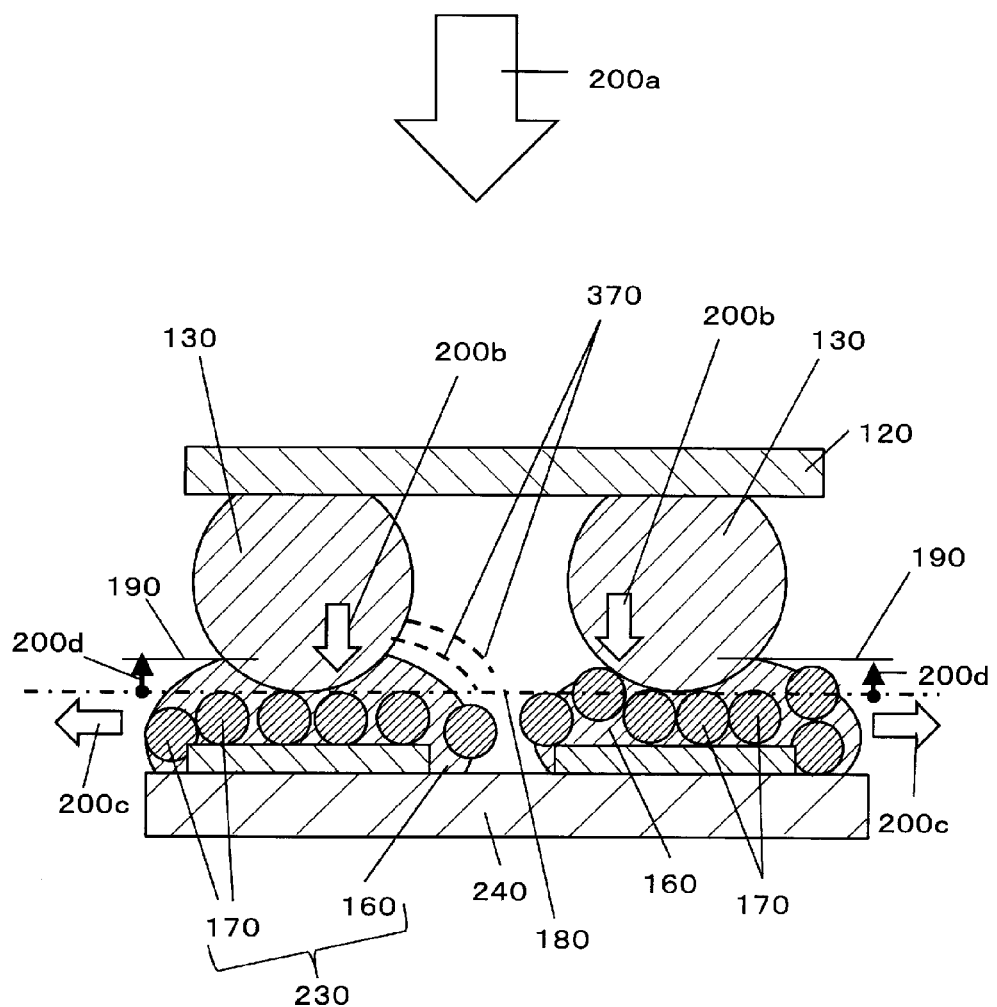
FIG. 11 is a sectional view of the example of mounting as the comparative example shown in FIG. 10, before a reflow process.
Figure 12:
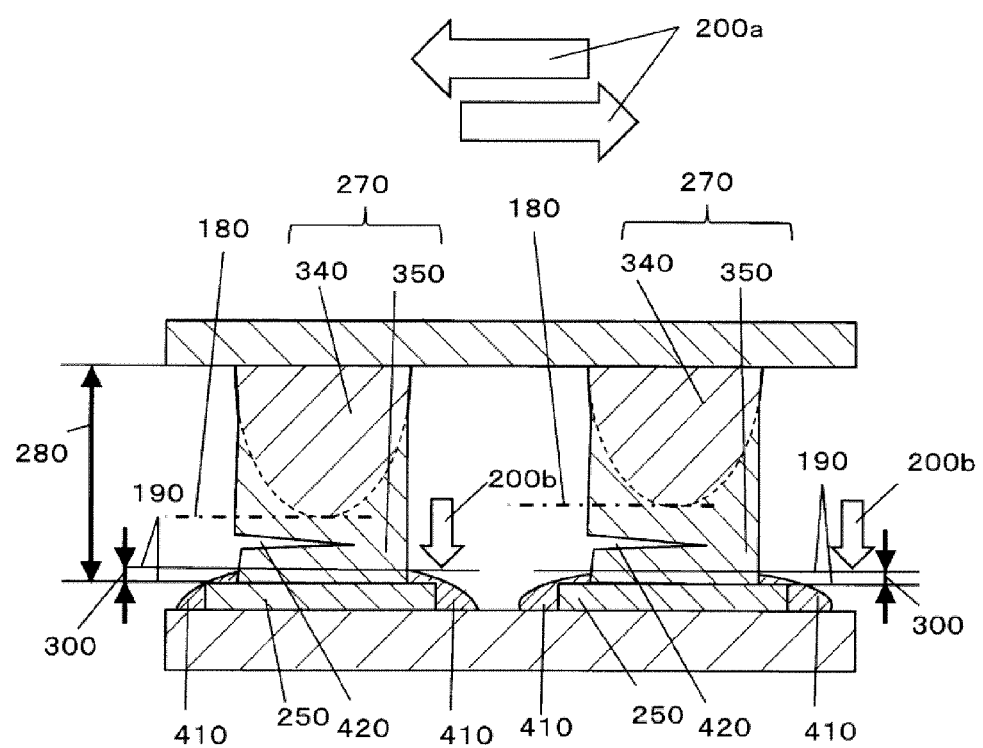
FIG. 12 is a sectional view of the example of mounting as the comparative example shown in FIG. 10, after a reflow process.

Hereinafter, problems occurred in sample C2 and their causes are studied referring to FIGS. 10 through 12. FIGS. 11 and 12 are respectively sectional views of sample C2, before and after a reflow process.

As described above, semiconductor component 400 of sample C2 shown in FIG. 10 does not have coating part 140 on the surfaces of bumps 130.

Arrow 200a in FIG. 11 indicates a direction in which semiconductor package 120 is loaded on circuit board 240. Both arrow 200b and dotted line 370 show circumstances in which the solder paste on wiring 250 or first composition 230 is pressed to bumps 130 to be thinner. Arrow 200c shows circumstances in which first composition 230 on wiring 250 is pressed by bumps 130 to be squeezed to the outside of wiring 250.

As shown in FIG. 11, sample C2 has a small amount of member that rises around bumps 130 as a type of bulge. Accordingly, the part formed of only first binder 160 indicated by arrow 200d is low in height.

As shown in FIG. 12, resin hardening part 410 coats solder bonding part 270 over a small range. Concretely, as shown in table 1, the height of the resin reinforcing part of sample C2 is 30%. Accordingly, as shown in table 1, solder bonding part 270 that is not covered with resin hardening part 410 may cause cracks 420 in the drop test, for example. Further, cracks 420 often concentrate on parts where a Bi component is contained in solder.

(5) Sample E5 through E10

Next, a description is made of samples E5 through E10, each of which is another example according to the embodiment.

In samples E5 through E7, solder is not formed on the electrodes of wirings 250. The heights of coating part 140 are respectively 80%, 60%, and 40% of that of bumps 130. Except for the conditions, they are the same as sample E1.

In sample E8, solder plating is formed on the electrodes of wirings 250. The amount of solder is the same as that of solder powder 170. The height of coating part 140 is 60% of that of bump 130. Except for the conditions, sample E8 is the same as E1.

In sample E9, the height of coating part 140 is 40% of that of bump 130; however, the thickness of coating part 140 is twice that of sample E1. Except for the conditions, sample E9 is the same as E1.

In sample E10, solder paste B described above is supplied onto the electrodes of wirings 250. The height of coating part 140 is 60% of that of bump 130; however, the thickness of coating part 140 is three times that of sample E1. Except for the conditions, sample E10 is the same as E1.

The formation and evaluation results of samples E5 through E10 are shown in table 2.

TABLE 2

|  | Sample | | | | | |
| --- | --- | --- | --- | --- | --- | --- |
|  | E5 | E6 | E7 | E8 | E9 | E10 |
| Solder paste on electrode | — | — | — | solder plating | solder paste A | solder paste B |
| Solder paste of coating part | A | A | A | A | A | A |

TABLE 2-continued

| | Sample | | | | | |
|---|---|---|---|---|---|---|
| | E5 | E6 | E7 | E8 | E9 | E10 |
| thickness ratio of coating part | 1 | 1 | 1 | 1 | 2 | 3 |
| Height (%) of coating part | 80 | 60 | 40 | 60 | 40 | 60 |
| Height (%) of resin reinforcing part | 100 | 100 | 60 | 100 | 100 | 100 |
| Temperature cycle | >1,000 cycles | >1,000 cycles | >1,000 cycles | >1,000 cycles | >1,000 cycles | >1,000 cycles |
| Drop test | >1,000 times | >1,000 times | >1,000 times | >1,000 times | >1,000 times | >1,000 times |

As shown in table 2, samples E5 through E10, with the height of coating part 140 of 40% or greater, have resin reinforcing part 290 with the height 40% or greater of that of solder bonding part 270. They show favorable results in the temperature cycle test and the drop test.

The results of samples E5 through E7 prove that it is appropriate that the height of coating part 140 is 40% or greater of that of bump 130 and the height of resin reinforcing part 290 is 60% or greater of that of solder bonding part 270 without requiring solder formed on the electrodes of wirings 250.

From the results of sample E8, if the height of coating part 140 is 60% of that of bump 130, the height of resin reinforcing part 290 is 100% of that of solder bonding part 270 even when solder plating is formed on wiring 250 Accordingly, sample E8 shows favorable results in the temperature cycle test and the drop test.

This is supposedly because first binder 160 contained in coating part 140 is squeezed to the outside of solder bonding part 270 when the solder plating melts and solder powder 170 contained in coating part 140 is unified with the melted solder plating. In other words, it is supposed that first binder 160 squeezed to the outside forms resin reinforcing part 290 along the side surface of bump 130.

The results of samples E9 and E10 prove that a thickly printed sample so that the thickness of solder paste A be greater makes the height of resin reinforcing part 290 greater, namely, 100% of the height of solder bonding part 270.

With sample E9, for example, while the height of coating part 140 is 40% of that of bump 130, the height of resin reinforcing part 290 is 100% of that of solder bonding part 270 as a result that the amount of solder paste A is increased to make coating part 140 thicker. This supposedly produces favorable results in the temperature cycle test and the drop test.

Figure 14:
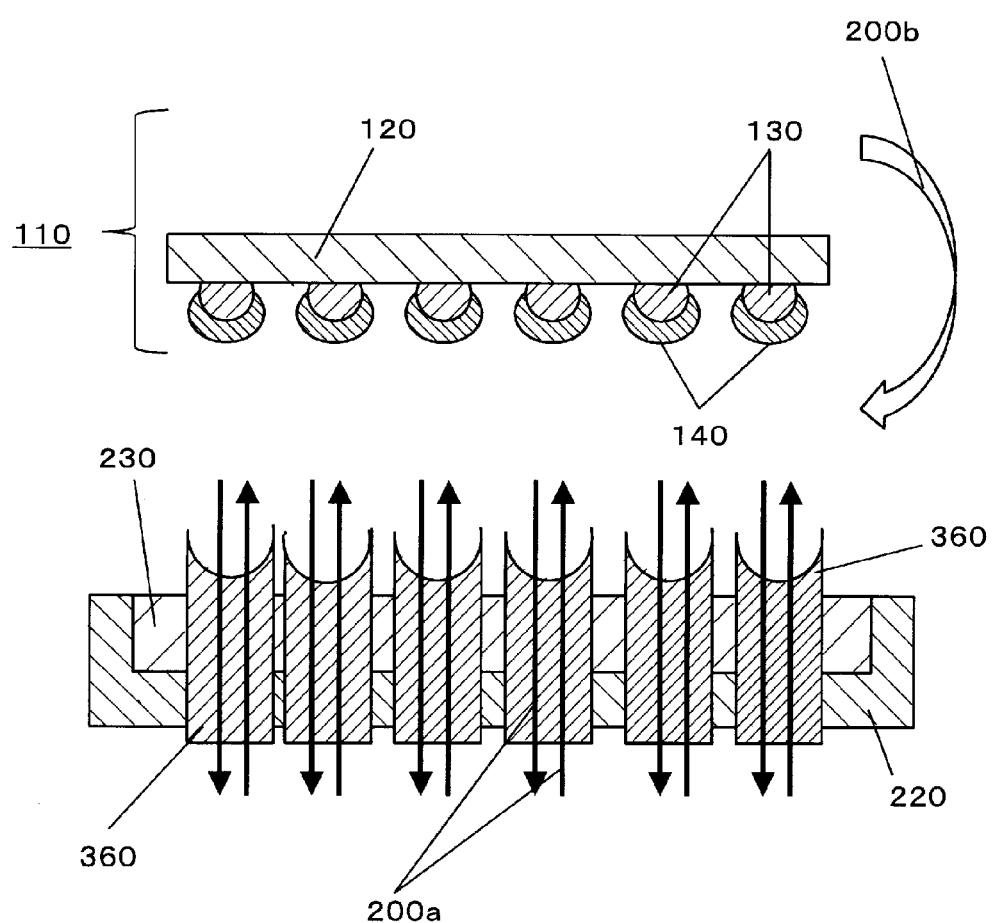
FIG. 14 illustrates a method for producing the semiconductor component shown in FIG. 13.

To make the thickness of solder paste A 10 μm or greater, further 20 μm or greater, it is effective to repeat the processes shown in FIGS. 3A and 3B or to perform the process described in the second embodiment in reference to FIG. 14. It is effective to make the thickness of the region, of coating part 140, which coats the top end of bump 130 be 10 μm or greater, 20 μm or greater, further 30 μm or greater.

With sample E10, the solder component of solder paste B is supposedly unified with solder powder 170 contained in coating part 140 in a reflow process to press up first binder 160 along the side surface of bump 130. Accordingly, the height of resin reinforcing part 290 is greater, namely, 100% of the height of solder bonding part 270. As a result, sample E10 shows favorite results are in temperature cycle test and drop test. Further, solder paste A thickly applied to the surfaces of bumps 130 increases the amount of first binder 160 and contributes to make resin reinforcing part 290 higher.

Second Exemplary Embodiment

Figure 13:
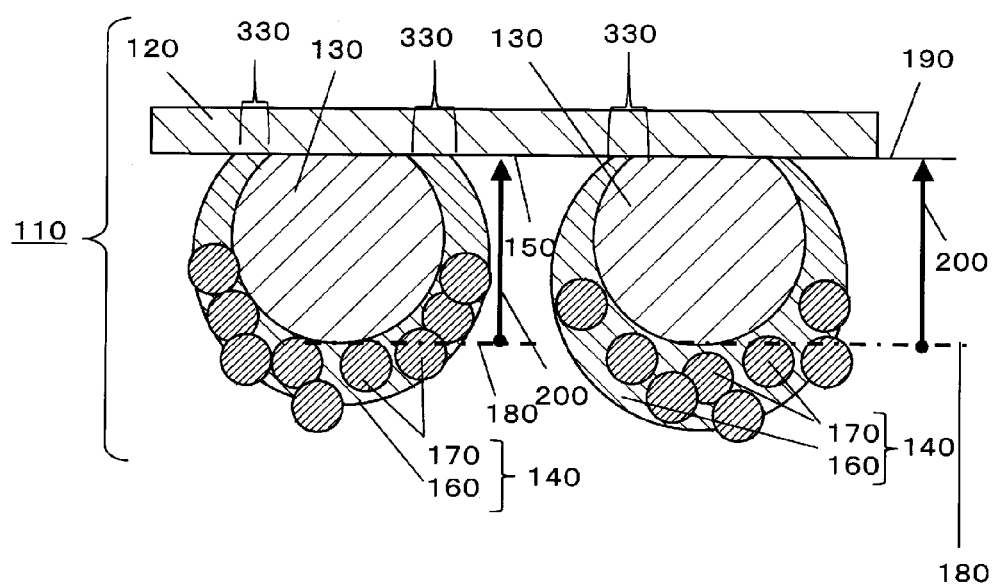
FIG. 13 is a sectional view of an essential part of a semiconductor component according to a second exemplary embodiment of the present invention.

FIG. 13 is a sectional view of semiconductor component 110 according to the second exemplary embodiment of the present invention. Semiconductor component 110 according to the embodiment has coating part 140 formed as far as to mountable face 150 of semiconductor package 120. Except for this, the second embodiment is the same as the first embodiment.

Figure 15A:
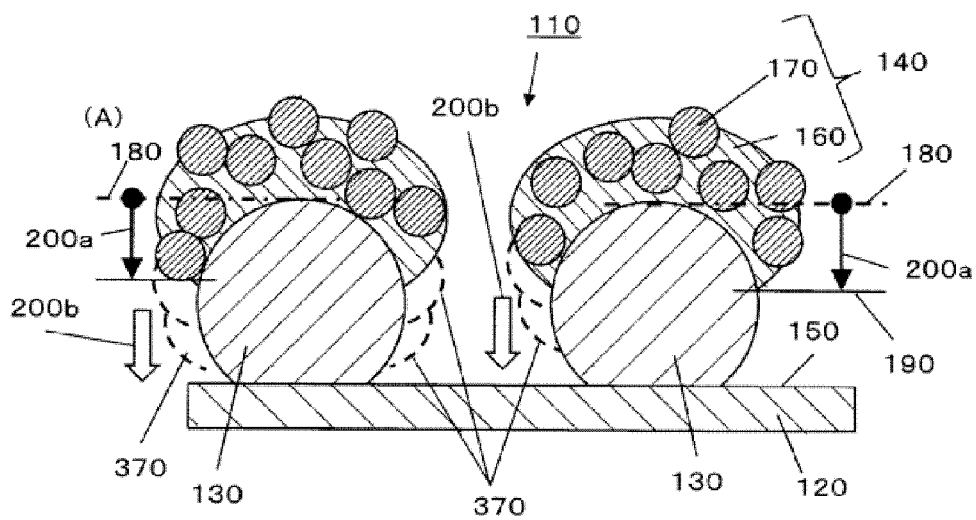
FIG. 15A is a sectional view showing an essential part and illustrating a procedure of producing the semiconductor component shown in FIG. 13.
Figure 15B:
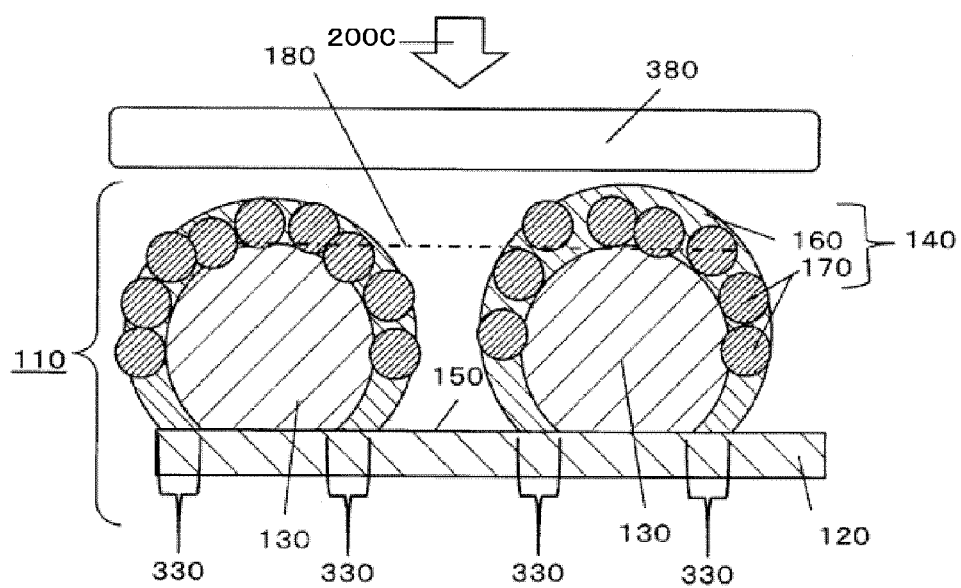
FIG. 15B is a sectional view showing the essential part and illustrating another procedure of producing the semiconductor component shown in FIG. 13.

Coating part 140 coating the surface of bump 130 adheres to mountable face 150 as well. In this case, to form coating part 140 on the surface of bump 130, the transfer method described on the basis of FIGS. 3A and 3B is unsuitable. To apply the transfer method described above, mountable face 150, besides the surface of bump 130, needs to contact the transfer surface of first composition 230 stored in the pool of transfer table 220. Doing so, however, all coating parts 140 of bumps 130 are connected with one another. Hence, to produce semiconductor component 110 according to the embodiment, it is appropriate to perform the processes shown in FIGS. 14 through 15B, for example. FIG. 14 illustrates a method of producing semiconductor component 110 shown in FIG. 13. FIGS. 15A and 15B are sectional views of essential parts illustrating the procedures of producing semiconductor component 110 shown in FIG. 13.

As shown in FIG. 14, the top part of each of first jig 360 is provided with a recess corresponding to the shape of each of bumps 130 at the position corresponding to respective one of bumps 130. These recesses are formed large enough to contain individual bumps 130, respectively. As shown by arrows 200a, by vertically moving first jigs 360, liquid-form first composition 230 is dipped up from transfer table 220 to be transferred onto the surfaces of bumps 130. By making the surface of first jigs 360 that contacts bumps 130 into a pan-like shape conforming to the shape of bump 130, first composition 230 can be formed as coating part 140 higher than the side surface of bump 130 and the barycenter of bump 130.

As indicated by arrow 200b, semiconductor component 110 may be turned upside down to allow coating parts 140 adhering to the surfaces of bumps 130 to flow toward semiconductor package 120 due to its own weight. Such flowing of coating parts 140 (first composition 230) is described referring to FIGS. 15A and 15B.

Arrows 200b and dotted lines 370 in FIG. 15A indicate circumstances in which coating part 140 coating bump 130 flows downward along the side surface of bump 130 when the top end of bump 130 is upward. In this way, coating part 140 flows toward semiconductor package 120 due to its own weight. In this case, as shown in FIG. 15B, a part of first binder 160 may adhere to mountable face 150.

Note that, as shown in FIG. 15B, second jig 380 may be moved in the direction of arrow 200c to be pressed to the top end of bump 130 for promoting flowing of coating part 140 as required. Second jig 380 can be made of polytetrafluoroethylene or silicone rubber having non-adherence. The elasticity and non-adherence of silicone rubber or the like help promoting flowing of coating part 140. Instead of second jig 380, air pressure by means of an air blower or the like may help promoting flowing of coating part 140.

Figure 16A:
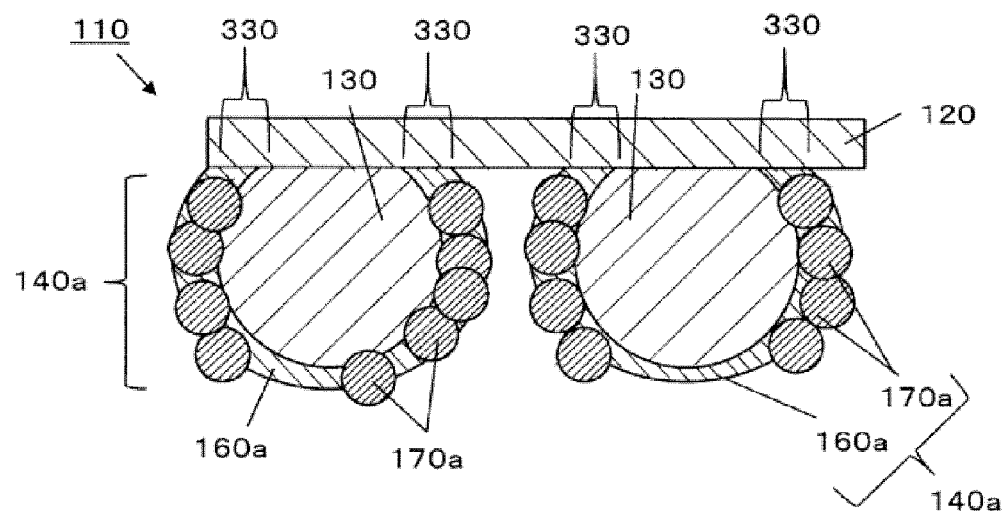
FIG. 16A is a sectional view showing an essential part of another semiconductor component according to the second embodiment.
Figure 16B:
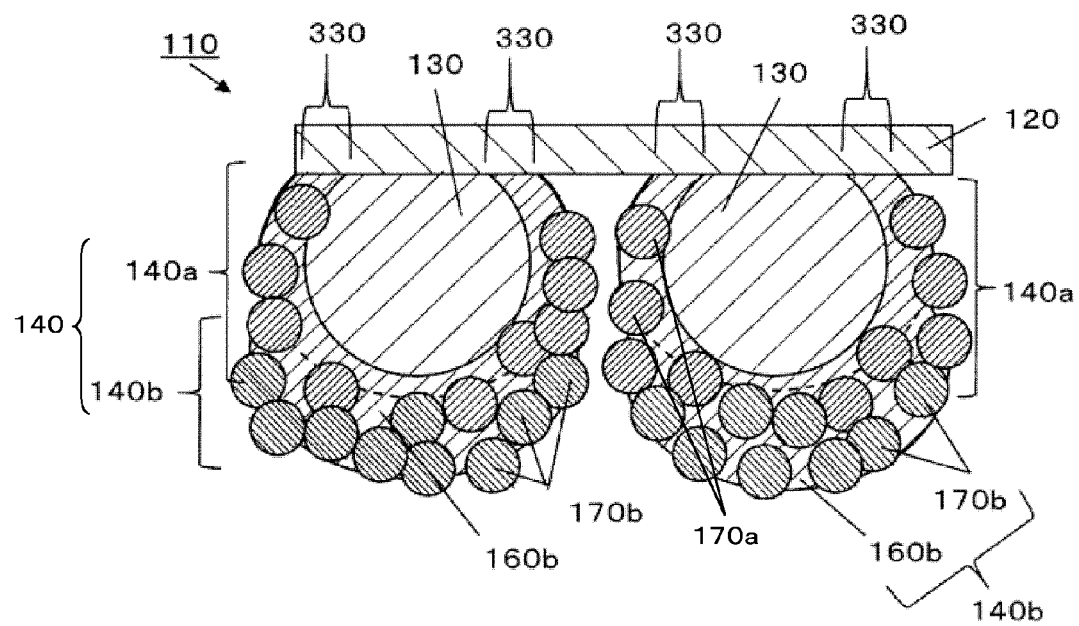
FIG. 16B is a sectional view showing an essential part of still another semiconductor component according to the second embodiment.

Next, a description is made of the amount of coating part 140 referring to FIGS. 16A and 16B. FIGS. 16A and 16B are sectional views of essential parts of semiconductor component 110 according to the embodiment, with different amounts of coating part 140.

As shown in FIG. 16A, when coating part 140a formed on bump 130 is made flow to near semiconductor package 120, the average thickness of first binder 160a formed on bump 130 and the distribution of solder powder 170a may be changed. In such cases, it is appropriate that, as shown in FIG. 16B, the first composition is supplied by, for example, application to further form coating part 140b so as to lay over coating part 140a. In other words, coating part 140b is laminated on coating part 140a. Repeating these processes increases the size and volume of coating part 140 and reduces their variations.

Although the first composition may be used for coating part 140b laid over coating part 140a, a composition containing a thermosetting resin binder having a component composition same as or similar to that of the first composition may be supplied. Alternatively, coating part 140b may be formed of a mixed composition of a first thermosetting resin binder and a flux component, or only of a first thermosetting resin binder. Doing so allows coating parts 140a and 140b to be favorably mixed together at the part where both overlap with each other, thereby eliminating interfaces therebetween. As a result, strong resin reinforcing part 290 that hardly generates cracks caused due to an interface is formed so as to cover nearly the whole outer circumference of solder bonding part 270. In the same way, solder bonding part 270 is formed stably as a result that solder powder 170a contained in coating part 140a and solder powder 170b contained in coating part 140b have the same or a similar component composition.

Third Exemplary Embodiment

Figure 17:
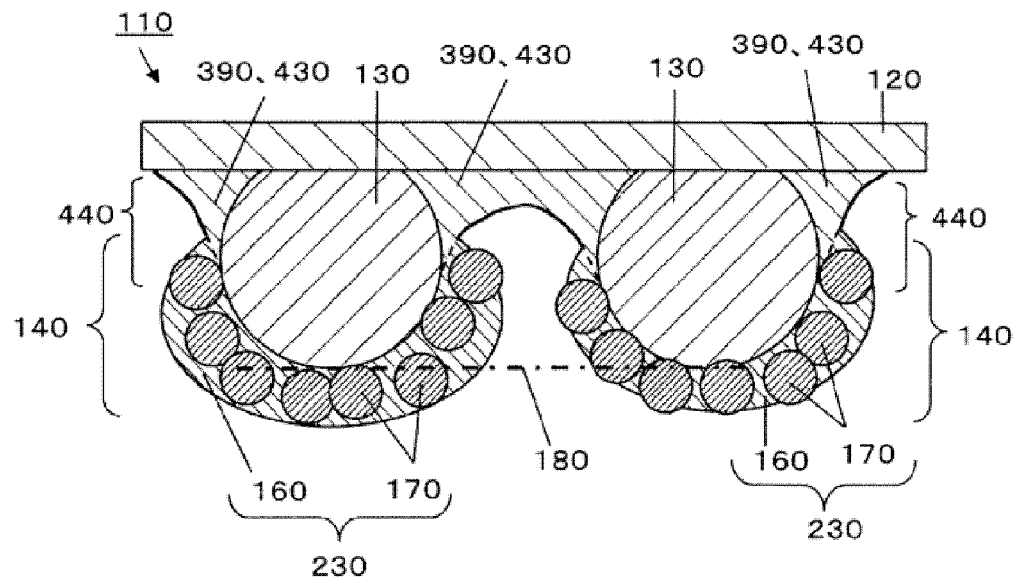
FIG. 17 is a sectional view showing an essential part of a semiconductor component according to a third exemplary embodiment of the present invention.

FIG. 17 is a sectional view of essential part of semiconductor component 110 according to the third exemplary embodiment of the present invention. FIG. 18 is an enlarged sectional view schematically illustrating the solder bonding structure of semiconductor-mounted product 310 according to this embodiment.

Semiconductor component 110 according to the embodiment includes auxiliary coating part 440 in addition to semiconductor component 110 according to the first embodiment shown in FIGS. 2A and 2B. Auxiliary coating part 440 coats a region that is not coated with coating part 140 on the surface of bump 130. In other words, auxiliary coating part 440 coats at least a region exposed from coating part 140 of bump 130. Auxiliary coating part 440 is formed of second composition 390 that contains second thermosetting resin binder (hereinafter, second binder) 430 and does not contain solder powder 170. Except for that, the third embodiment is the same as the first embodiment.

Coating part 140 is formed so as to cover at least the region of the top end of bump 130 as shown in FIG. 2A for example. Accordingly, the surface of bump 130 that is not coated with coating part 140 refers to the region from the end position of coating part 140 indicated by auxiliary line 190 to mountable face 150 of component 110 in FIG. 2A. Hence, auxiliary coating part 440 covers the region of the side surface of bump 130, closer to mountable face 150.

Auxiliary coating part 440 does not contain solder powder 170 and thus may be provided so as to lie across from the side surface of bump 130 to mountable face 150 as shown in FIG. 17. Furthermore, auxiliary coating parts 440 provided on adjacent two bumps 130 may contact each other to be linked together. Even doing so does not cause adjacent two bumps 130 to electrically conduct. Rather, it is preferable that auxiliary coating part 440 lies across from the side surface of one of bumps 130 to mountable face 150, and further is made link to auxiliary coating part 440 on next bump 130. This configuration provides a stronger resin reinforce structure. Clearly, adjacent auxiliary coating parts 440 may be separated and independent from each other.

During a reflow process, the viscosity of auxiliary coating part 440 decreases. Then, auxiliary coating part 440 is unified with melted first binder 160 of coating part 140 and forms resin reinforcing part 290 surrounding the side surface of solder bonding part 270 as shown in FIG. 18. After all, the presence of auxiliary coating part 440 allows resin reinforcing part 290 covering the entire periphery of solder bonding part 270 to be formed more reliably.

Note that a part of auxiliary coating part 440 may overlap with a part of coating part 140. This overlapping facilitates unifying first binder 160 of coating part 140 with second binder 430 of auxiliary coating part 440 melted during a reflow process, thereby forming resin reinforcing part 290 more reliably.

Next, a more detailed description is made of second composition 390. Second binder 430 contained in second composition 390 is present in an unhardened or B-stage state in auxiliary coating part 440. After melted during a reflow process, second binder 430 hardens with first binder 160 to form resin reinforcing part 290.

The material of second binder 430 is not especially limited as long as resin reinforcing part 290 can be formed; however, the material of second binder 430 favorably contains an epoxy resin and a hardening agent as main components similarly to first binder 160. Examples of a usable epoxy resin and hardening agent include compounds similar to those exemplified in the description of first binder 160. Further, first binder 160 and second binder 430 are favorably made of the same material, or of similar materials having compatibility with each other. This allows first binder 160 and second binder 430 to be favorably mixed together at a part where auxiliary coating part 440 and coating part 140 are overlapped with each other.

Second composition 390 does not contain solder powder 170, and thus a flux component is not essential; however, may contain it as required. Second composition 390, besides the above-described components, may contain a property modifier, additive, or the like, similarly to first composition 230.

Figure 19A:
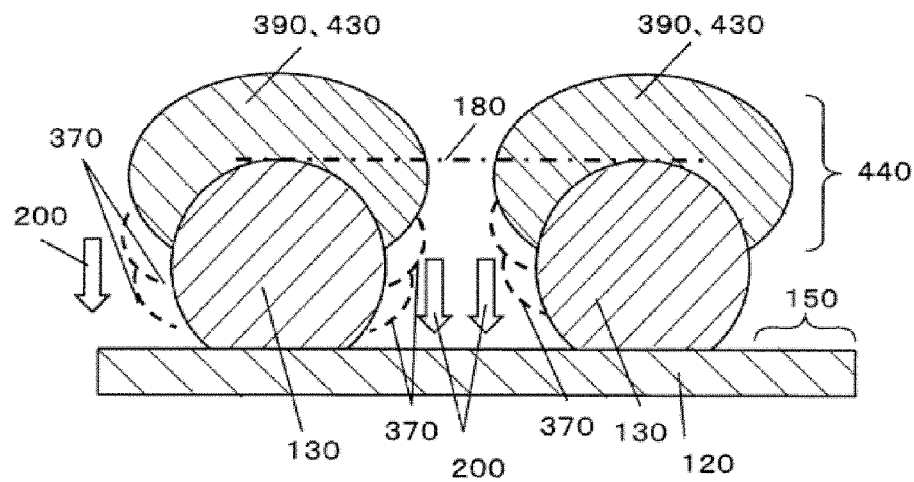
FIG. 19A is a sectional view showing an essential and illustrating a procedure of producing a semiconductor component according to the third embodiment.
Figure 19B:
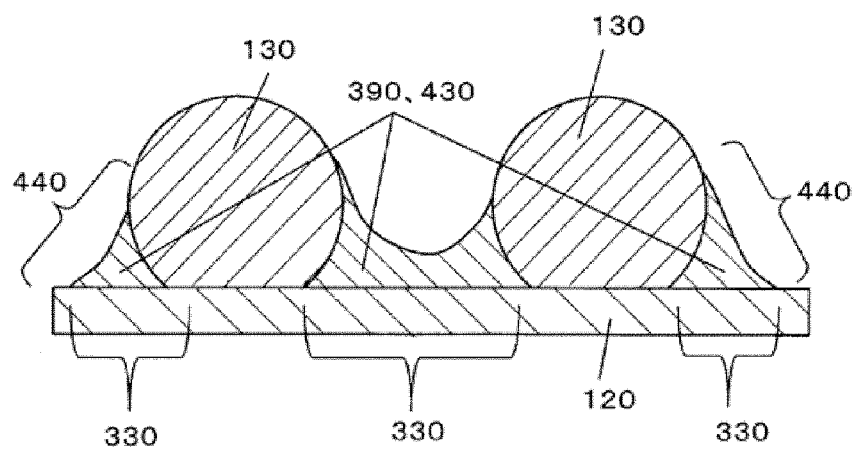
FIG. 19B is a sectional view showing the essential and illustrating a procedure subsequent to the procedure shown in FIG. 19A.
Figure 19C:
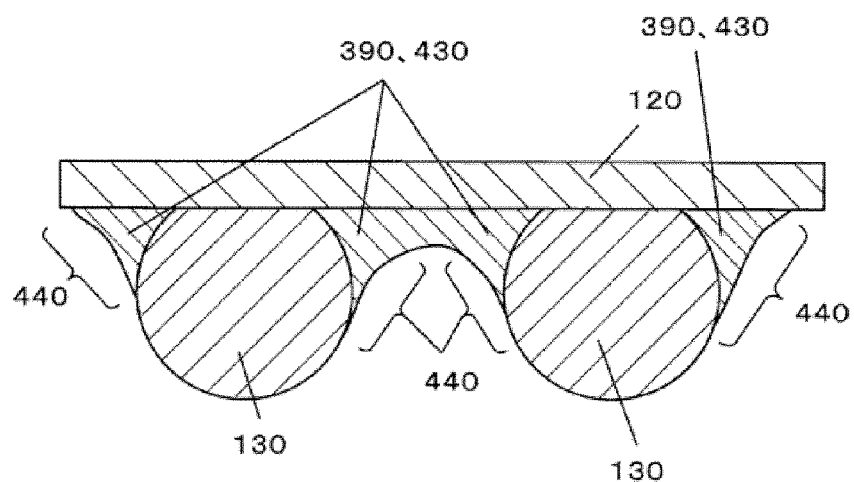
FIG. 19C is a sectional view showing the essential and illustrating a procedure subsequent to the procedure shown in FIG. 19B.

Next, a description is made of a method of producing semiconductor component 110 according to the embodiment referring to FIGS. 19A through 19C. FIGS. 19A through 19C are sectional views of an essential part illustrating a procedure of producing semiconductor component 110 according to the embodiment.

Second composition 390 may adhere to bumps 130 on semiconductor package 120 through a following manner, for example. Second composition 390 can be made adhere to bumps 130 by applying the process shown in FIGS. 3A and 3B, for example. More specifically, the recessed pool provided in transfer table 220 is filled with first composition 230 in FIGS. 3A and 3B; however, second composition 390 is used instead of first composition 230. Then, immersing bumps 130 on semiconductor package 120 in second composition 390 allows second composition 390 to adhere to the part from the top end to the side surface of bump 130. Alternatively, the process shown in FIG. 14 may be modified to apply.

Next, as shown in FIG. 19A, second composition 390 adhering to bump 130 is flown downward along the side surface of bump 130 by making the top end of bump 130 upward. In this way, second composition 390 flows toward mountable face 150 of semiconductor package 120 due to its own weight. This allows the region of the side surface of bump 130 closer to mountable face 150 to be covered with auxiliary coating part 440 as shown in FIG. 19B. Here, mountable face 150 may also be covered continuously with auxiliary coating part 440. On mountable face 150, auxiliary coating parts 440 formed on respective bumps 130 may be linked together.

To optimize the fluidity of second composition 390, viscosity, thixotropy, tack, and the like have only to be adjusted. For this purpose, second composition 390 may contain a thermoplastic resin, additive, and insulative additive such as an inorganic filler, as appropriate.

After this process, as shown in FIG. 19C, the top end of bump 130 with auxiliary coating part 440 formed thereon is made face downward. Then, first composition 230 is supplied to the surface of bump 130 to form coating part 140 shown in FIG. 17.

Concretely, the process shown in FIGS. 3A, 3B and 14 is performed on the intermediate in the state of FIG. 19C. In this manner, as shown in FIG. 17, first composition 230 adheres to the region from the top end to the side surface of bump 130, so as to form coating part 140. Here, as described above, coating part 140 may be formed so that coating part 140 and auxiliary coating part 440 are partially overlapped with each other. Further, by coating the region of bump 130 where coating part 140 does not coat with auxiliary coating part 440 to complement the region, the entire outer circumference of solder bonding part 270 can be covered with strong resin reinforcing part 290.

Meanwhile, the process of forming auxiliary coating part 440 shown in FIGS. 19A through 19C may be transposed with that of forming coating part 140. Doing so causes a part of coating part 140 to be formed on a part of auxiliary coating part 440. That is, the region of bump 130 that is not coated with coating part 140 may be coated with auxiliary coating part 440.

Semiconductor-mounted product 310 shown in FIG. 18 can be formed by mounting semiconductor component 110 shown in FIG. 17 as shown in FIGS. 6 and 7 described above. Resin reinforcing part 290 shown in FIG. 18 is formed in a state where first binder 160 contained in first composition 230 and second binder 430 contained in second composition 390 are favorably mixed with each other and integrally harden without interfaces therebetween.

Fourth Exemplary Embodiment

As described referring to FIG. 8 in the first embodiment, the height of resin reinforcing part 290 (height of a part of resin reinforcing part 290 farthest from wiring 250) preferably falls in the range from 40% to 100%, inclusive, of the height of solder bonding part 270 from wiring 250 as a reference. However, if the height of resin reinforcing part 290 is 100% of the height of solder bonding part 270 over the entire circumference of solder bonding part 270 as shown on the right-hand side of FIG. 8, another problem related to reliability may occur.

Solder contained in solder bonding part 270 remelts as solder bonding part 270 is reheated. Remelted solder expands, compared to that before melting. Reheating also causes warpage in circuit board 240. These result in increasing pressure of the remelted solder. If any portion of resin reinforcing part 290 is weakly attached to semiconductor package 120 or circuit board 240, the remelted solder is pushed out from that portion and causes defects such as short-circuiting in some cases. This phenomenon is called solder flash in the following description.

In order to suppress such solder flash, it is effective that resin reinforcing part 290 is formed such that the height of resin reinforcing part 290 is not 100% of the height of solder bonding part 270 over the entire circumference (periphery) of solder bonding part 270. In this state, the remelted solder is exposed (opened) at a portion not covered with resin reinforcing part 290, and thus pressure of the remelted solder will not significantly increase. Accordingly, the solder flash can be suppressed.

Concretely, the solder flash can be suppressed by the next method. Quantity of first binder 160a and/or first binder 160b is defined to control the height of resin reinforcing part 290 to be less than 100% of the height of solder bonding part 270 as in samples E1 through E4 in Table 1 and sample E7 in Table 2. More concretely, quantity of flux component in the first binder is controlled.

Figure 20A:
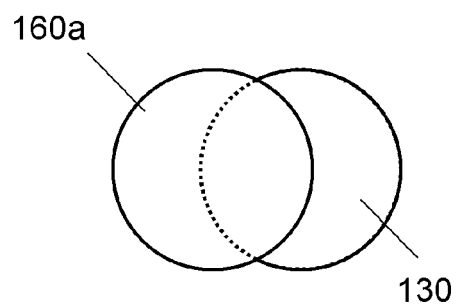
FIG. 20A is a plan view showing shapes and positional relationship of a bump and a first thermosetting resin binder when the first thermosetting resin binder is applied to the bump according to a fourth exemplary embodiment of the present invention.
Figure 20B:
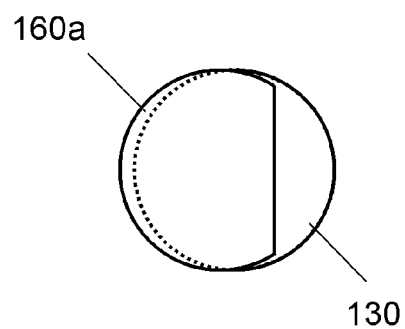
FIG. 20B is a plan view showing another shapes and positional relationship of the bump and the first thermosetting resin binder when the first thermosetting resin binder is applied to the bump according to the fourth exemplary embodiment of the present invention.

The solder flash can also be suppressed employing other methods. Specific examples thereof are described below referring to FIGS. 20A and 20B. FIGS. 20A and 20B are plan views showing shapes and positional relationship of bump 130 and first binder 160a when first binder 160a is applied to bump 130 in this embodiment.

In an example shown in FIG. 20A, first binder 160a is supplied to bump 130 such that the center of first binder 160a is deviated from the center of bump 130. On the other hand, in an example shown in FIG. 20B, first binder 160a is supplied to bump 130 in a shape that a part of the outer circumference of first binder 160a is absent. In those ways, first binder 160a supplied to bump 130 in the unbalanced (biased) state can form resin reinforcing part 290 with different heights at the right-hand side and left-hand side of the figure. In other words, resin reinforcing part 290 can be formed to have a height shorter to the right than that to the left of bump 130. In FIG. 20B, an arc portion of first binder 160a is disposed outside of bump 130; however, it may also coincide with the outer circumference of bump 130.

To supply first binder 160a shown in FIGS. 20A and 20B to bump 130, bump 130 is covered with a mask provided with a hole and first binder 160a is printed through the hole of the mask, for example. In this method, the center of the hole created in the mask is deviated from the center of bump 130. Alternatively, the hole has an imperfect circular shape.

Figure 21:
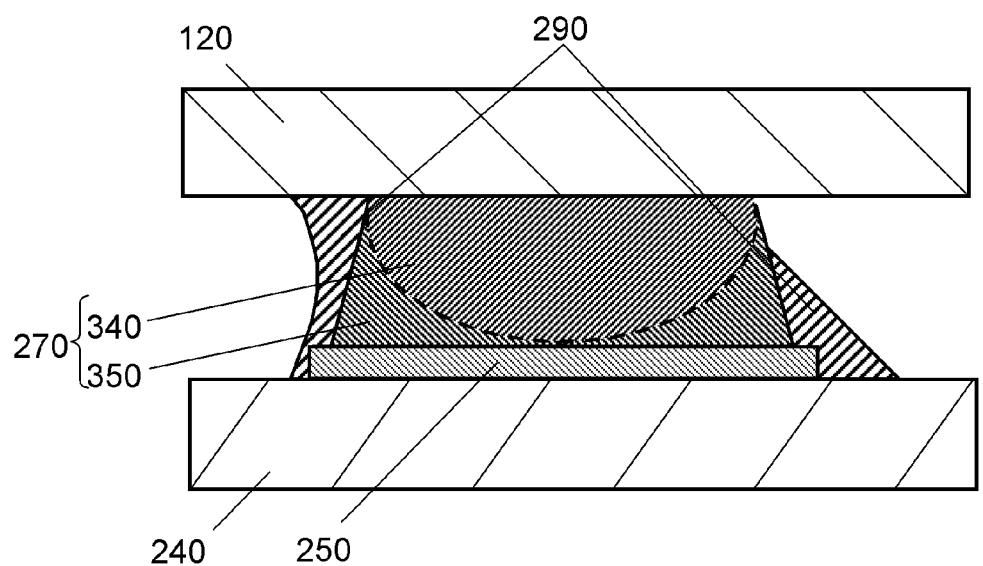
FIG. 21 is an enlarged sectional view schematically illustrating the solder bonding structure of a semiconductor-mounted product according to the fourth embodiment.

As described above, the higher resin reinforcing part 290 is, the higher the reinforcing effect is on solder bonding part 270. It is particularly preferable that the height of resin reinforcing part 290 is 100% of that of solder bonding part 270 and the resin reinforcing part 290 substantially extends from circuit board 240 to semiconductor package 120. Accordingly, as shown in FIG. 21, a part of resin reinforcing part 290 continuously coats a part extending from circuit board 240 to a mounted face of semiconductor package 120 along the side surface of solder bonding part 270 continuously. Stated differently, the resin reinforcing part 290 entirely coats (100% of the height) a first peripheral section (left side of FIG. 21) of the side surface of the solder bonding part 270 extending continuously from the circuit board 240 to the mounted face of semiconductor package 120. The resin reinforcing part 290 also partially coats (less than 100% of the height) a second peripheral section (right side of FIG. 21) of the side surface of the solder bonding part 270 to partially expose the solder bonding part. Except for this, the fourth embodiment is the same as other embodiments.

Figure 22A:
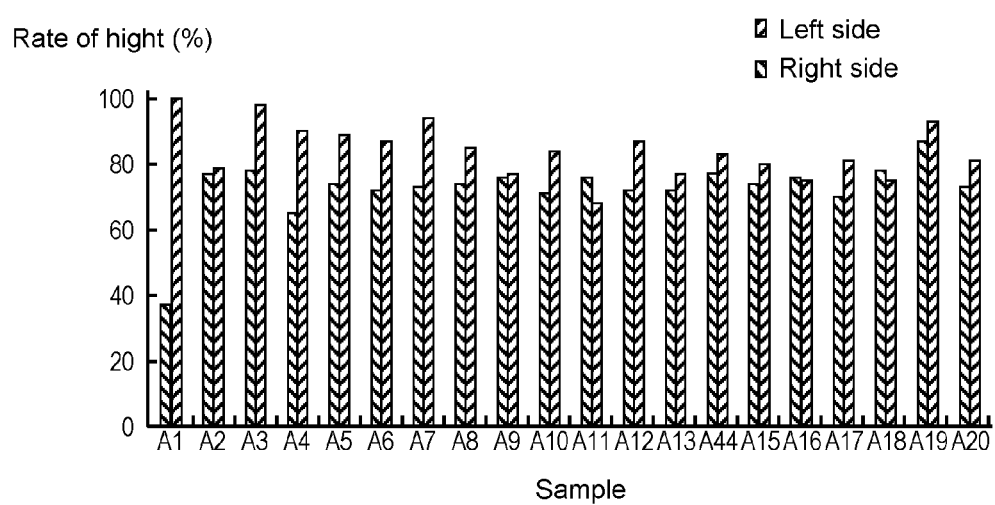
FIG. 22A shows left and right heights of the resin reinforcing part in each of examples of the solder bonding part produced by the first thermosetting resin binder in FIG. 20A.
Figure 22B:
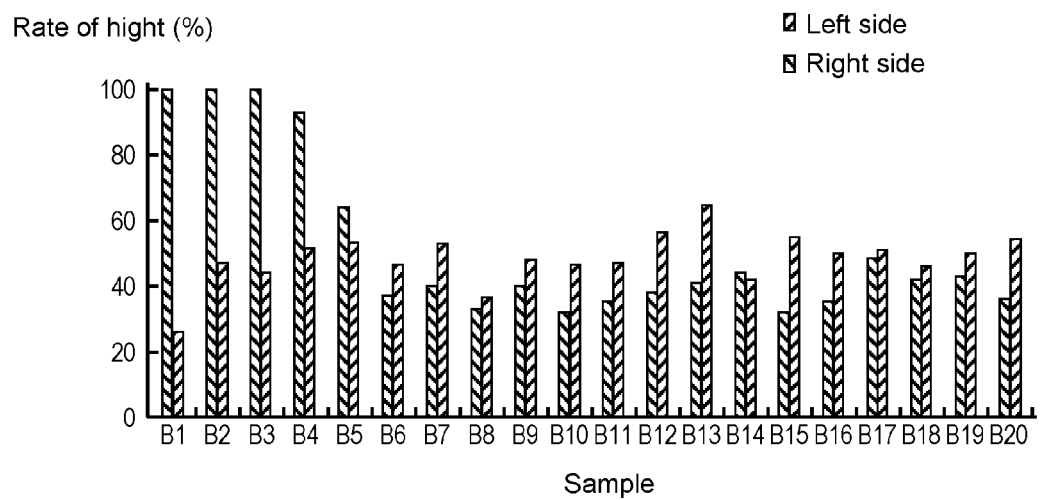
FIG. 22B shows left and right heights of the resin reinforcing part in each of examples of the solder bonding part in which the center of the solder bonding part is further deviated from the center of the bump than the first thermosetting resin binder in FIG. 20A.

FIG. 22A shows left and right heights of resin reinforcing part 290 in various samples in which first binder 160a shown in FIG. 20A is used on producing solder bonding part 270. FIG. 22B shows left and right heights of resin reinforcing part 290 in various samples in which the center of first binder 160a is deviated from the center of bump 130 more than that of first binder 160a in FIG. 20A on producing solder bonding part 270. In all the cases, 300 pieces of samples are produced and reheated up to 250° C. but no solder flash has occurred. On the other hand, a sample in which first binder 160a is supplied to bump 130 such that the center of first binder 160a coincides with the center of bump 130 and the height of resin reinforcing part 290 is 100% of the height of solder bonding part 270 over the entire circumference of solder bonding part 270 has the structure shown on the right-hand side of FIG. 8. Solder flash has occurred in five pieces when 300 pieces of this sample are produced and reheated up to 250° C.

In FIG. 22A, the coverage of solder bonding part 270 with resin reinforcing part 290 is relatively high in samples A1, A3, and A19. In FIG. 22B, the coverage of solder bonding part 270 with resin reinforcing part 290 is relatively high in sample B2. The left and right heights of resin reinforcing part 290 are 38% and 100% in sample A1, 79% and 98% in sample A3, 86% and 91% in sample A19, and 100% and 48% in sample B2 with respect to solder bonding part, respectively. In principle, it is enough to expose only a small portion of solder bonding part 270 from resin reinforcing part 290. Therefore, left and right heights of resin reinforcing part 290 may be 100% and 99%, for example.

The description referring to FIGS. 20A and 20B refers to the case of applying first binder 160a to bump 130. Alternatively, the shape and/or position of first binder 160b applied to wiring 250 may be controlled.

INDUSTRIAL APPLICABILITY

A semiconductor component and a semiconductor-mounted product according to the present invention increase the reliability of various types of electronic devices.

The invention claimed is:

1. A semiconductor-mounted product comprising:
a semiconductor package;
a circuit board having a surface on which wiring is formed and the semiconductor package is mounted;
a solder bonding part electrically connecting the semiconductor package with the wiring; and
a resin reinforcing part formed on a side surface of the solder bonding part,
wherein the solder bonding part has a first solder region formed closer to the semiconductor package than to the circuit board, and a second solder region formed closer to the circuit board than to the semiconductor package, the solder bonding part being partially exposed from the resin reinforcing part, and
wherein the resin reinforcing part is configured to entirely coat a first peripheral section of the side surface of the solder bonding part extending continuously from the circuit board to a mounted face of the semiconductor package, and to partially coat a second peripheral section of the side surface of the solder bonding part so as to partially expose the solder bonding part.

2. The semiconductor-mounted product according to claim 1,
wherein the first solder region is mainly made of Sn—Ag—Cu-based first solder, and the second solder region is mainly made of Sn—Bi-based or Sn—Bi—Ag—Cu-based second solder.

3. The semiconductor-mounted product according to claim 1,
wherein a part of the resin reinforcing part farthest from the wiring has a height falling within a range from 40% to 100%, inclusive, of a height of the solder bonding part from the wiring as a reference.

4. The semiconductor-mounted product according to claim 1,
wherein the second solder region contains Bi, and the resin reinforcing part covers at least a side surface of the second solder region.

5. The semiconductor-mounted product according to claim 1,
wherein the resin reinforcing part covers the side surface of the second solder region and covers a side surface of the first solder region so as to extend from the side surface of the second solder region to the side surface of the first solder region.

6. The semiconductor-mounted product according to claim 1, further comprising an insulative fill material that connects the semiconductor package with the circuit board, at a rim of the semiconductor package.

7. A method of producing a semiconductor-mounted product, comprising:
supplying a bump made of first solder with a first thermosetting resin binder containing solder powder made of second solder and a flux component, the bump being formed on a mountable face of a semiconductor package of a semiconductor component;
supplying an electrode formed on a surface of a board with solder paste by print or application;
mounting the semiconductor component of which bump is supplied with the first thermosetting resin binder, on the board of which electrode is supplied with the solder paste;
forming a resin reinforcing part from which a solder bonding part is partially exposed, the resin reinforcing part reinforcing the solder bonding part from a region around the solder bonding part by:
forming the solder bonding part connecting the electrode with the semiconductor component by heating the board mounted with the semiconductor component according to a given heating profile so as to melt-solidify the bump and to melt-unify the solder powder, and
hardening the first thermosetting resin binder.

8. The method according to claim 7,
wherein the solder paste is formed of a thermosetting resin binder similar to the first thermosetting resin binder, the thermosetting resin binder containing an identical solder powder as the solder powder of the first thermosetting resin binder and an identical flux component as the flux component of the first thermosetting resin binder.

9. The method according to claim 7,
wherein the first thermosetting resin binder is supplied to the bump such that a center of the first thermosetting resin binder is deviated from a center of the bump.

10. The method according to claim 7,
wherein the first thermosetting resin binder is supplied to the bump in a shape that a part of an outer circumference of the first thermosetting resin binder is absent.

11. The method according to claim 7,
wherein the resin reinforcing part is formed such that a part of the resin reinforcing part continuously coats a part from the circuit board to a mounted face of the semiconductor package through the side surface of the solder bonding part.

* * * * *